United States Patent [19]
Yoshitake et al.

[11] Patent Number: 5,808,944
[45] Date of Patent: Sep. 15, 1998

[54] SEMICONDUCTOR MEMORY DEVICE HAVING A DEFECT RELIEF ARRANGEMENT

[75] Inventors: Takayuki Yoshitake, Akishima; Kazuyoshi Oshima, Ome; Kazuyuki Miyazawa, Hidaka; Toshihiro Tanaka, Akiruno; Yasuhiro Nakamura, Tachikawa; Shigeru Tanaka, Akishima; Atsushi Ohba, Kobe, all of Japan

[73] Assignees: Hitachi, Ltd.; Mitsubishi Denki Kabushiki Kaisha; Hitachi ULSI Engineering Corp., all of Tokyo, Japan

[21] Appl. No.: 797,654

[22] Filed: Jan. 31, 1997

[30] Foreign Application Priority Data

Feb. 8, 1996 [JP] Japan .................................... 8-046706
Jan. 10, 1997 [JP] Japan .................................... 9-014682

[51] Int. Cl.$^6$ ...................................................... G11C 7/00
[52] U.S. Cl. ...................... 365/200; 365/236; 365/185.09
[58] Field of Search .............................. 365/200, 96, 236, 365/185.09

[56] References Cited

U.S. PATENT DOCUMENTS 5,097,447  3/1992  Ogawa ..................................... 365/236
5,339,344  8/1994  Kimura ..................................... 365/200

OTHER PUBLICATIONS

IEEE Int'l Solid–State Circuits Conference, 1980, pp. 152 and 153.
IEEE, J. Solid–State Circuits, vol. 23, No. 5, (1988), pp. 1157–1163.
IEEE Int'l Solid–State Circuits Conference, 1987, pp. 76 and 77.

Primary Examiner—A. Zarabian
Attorney, Agent, or Firm—Antonelli, Terry, Stout & Kraus, LLP

[57] ABSTRACT

In a semiconductor storage device wherein data lines connected to a plurality of memory cells selected by a select operation of word lines are sequentially selected by using an address signal generated by an address counter to serially read data in individual unit of at least one word line: redundancy data lines disposed perpendicular to the word lines are provided; a column select circuit receiving a Y address signal selects one of the data lines or redundancy data lines; a redundancy memory circuit stores, in the order of the selection operation by the column select circuit, a defect address signal of a defect data line among the data lines and a redundancy address signal of a corresponding redundancy data line; an address comparator circuit compares one defect address signal read from the redundancy memory circuit with an address signal generated by the address counter; an address signal for the redundancy memory circuit is generated by performing a count operation in response to a coincidence signal generated by the address comparator circuit; and the address signal generated by the address counter is replaced by a redundancy address signal read in response to the coincidence signal from the redundancy memory circuit and used as the Y address signal. Accordingly, a redundancy circuit of simple configuration can be obtained because only a single address comparator circuit is used.

6 Claims, 16 Drawing Sheets

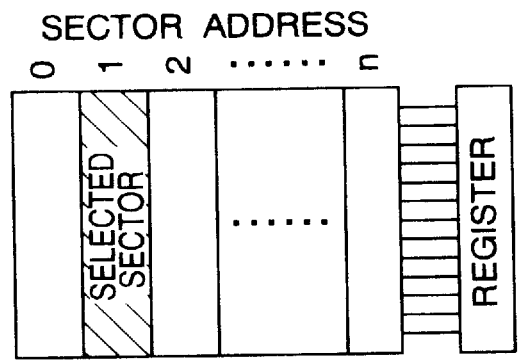
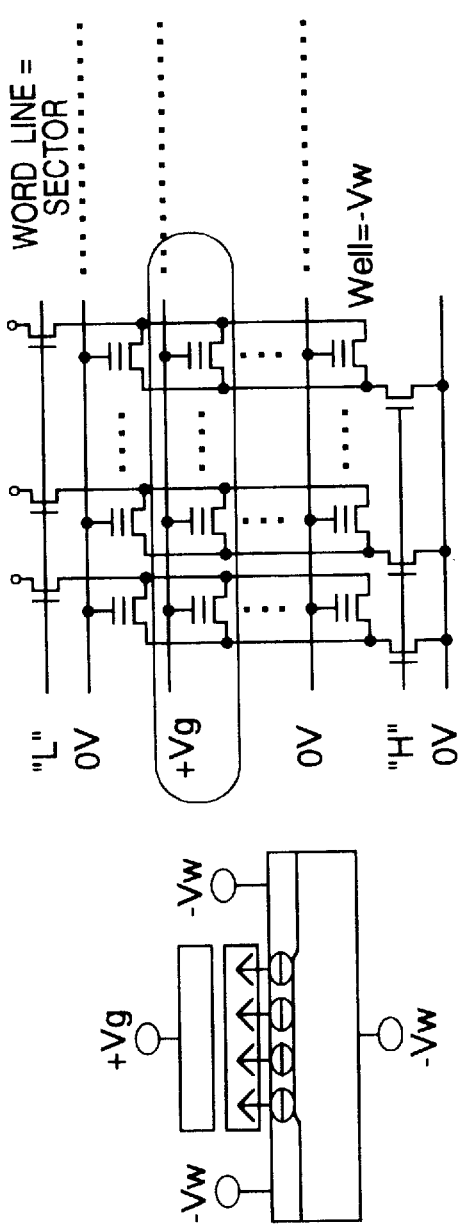
FIG.15A  FIG.15B  FIG.15C

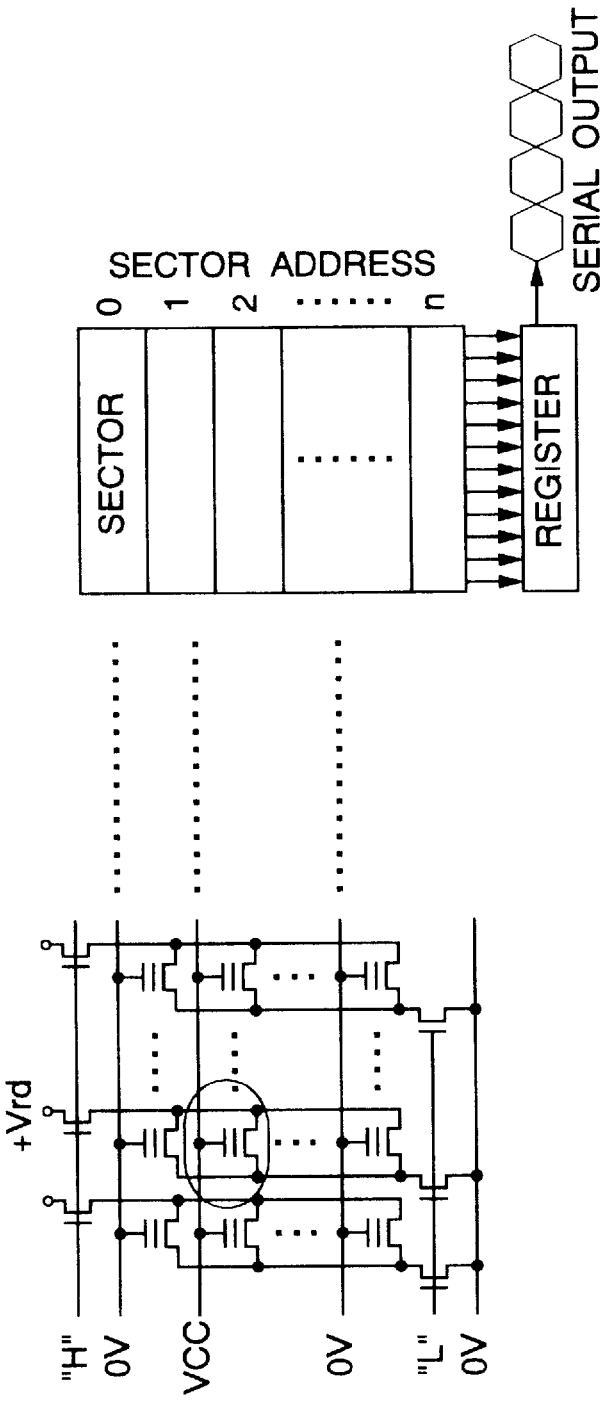

SEMICONDUCTOR MEMORY DEVICE HAVING A DEFECT RELIEF ARRANGEMENT

BACKGROUND OF THE INVENTION

The present invention relates to a semiconductor memory device, and more particularly to techniques suitable for use as defect relief techniques of collective erase type EEPROMs (electrically erasable and programmable read only memory) to and from which data is serially input and output by mainly using internally generated address signals.

A collective erase type EEPROM is a semiconductor memory having a function of electrically erasing collectively all memory cells of the chip or a group of some memory cells. Such a collective erase type EEPROM (hereinafter simply called a flash memory) is described, for example, in IEEE INTERNATIONAL SOLID-STATE CIRCUITS CONFERENCE, 1980, pp. 152 and 153, IEEE INTERNATIONAL SOLID-STATE CIRCUITS CONFERENCE, 1987, pp. 76 and 77, and IEEE. J. SOLID-STATE CIRCUITS, vol. 23, no. 5 (1988), pp. 1157–1163.

SUMMARY OF THE INVENTION

Prior to application of this invention, the present inventors proposed a flash memory of the type that data erase and serial data read/write are performed in individual units of at least one word line. In this case, if one word line is processed as one sector, a semiconductor memory device compatible with a magnetic disk memory can be obtained. In order to realize a memory capacity of such a semiconductor memory device comparable to the magnetic disk memory, it is important to establish how much memory capacity one semiconductor chip can have. At the same time, in order to reduce manufacture cost, it is essential to realize high product yield and provide a defect relief circuit. However, such a defect relief circuit occupies an additional area of the semiconductor chip and sacrifices the memory capacity correspondingly. From this viewpoint, semiconductor memory devices have been developed which can realize defect relief with simple configuration by positively utilizing serial data read/write operations in individual of at least one word line.

It is an object of the present invention to provide a semiconductor memory device provided with a defect relief circuit with a simple configuration capable of serial data input/output in individual of at least one word line. The above and other objects and novel features of this invention will become apparent from the following description of the invention when read in conjunction with the accompanying drawings.

The summary of a typical one of the inventions disclosed in this specification will be briefly described in the following discussion. In a semiconductor memory device wherein data lines connected to a plurality of memory cells selected by a select operation of word lines are sequentially selected by using an address signal generated by an address counter to serially read data in individual units of at least one word line: redundancy data lines disposed perpendicular to the word lines are provided; a column select circuit receiving a Y address signal selects one of the data lines or redundancy data lines; a redundancy memory circuit stores, in the order of selection operation by the column select circuit, a defect address signal of a defect data line among the data lines and a redundancy address signal of a corresponding redundancy data line; an address comparator circuit compares one defect address signal read from the redundancy memory circuit with an address signal generated by the address counter; an address signal for the redundancy memory circuit is generated by performing a count operation in response to a coincidence signal generated by the address comparator circuit; and the address signal generated by the address counter is replaced by a redundancy address signal read in response to the coincidence signal from the redundancy memory circuit and used as the Y address signal.

The summary of another typical one of the inventions disclosed in this specification will be briefly described in the following discussion. In a semiconductor memory device wherein data lines connected to a plurality of memory cells selected by a select operation of word lines are sequentially selected by using an address signal generated by an address counter to serially read data in unit of at least word line: a redundancy memory circuit stores, in the order of data line selection operation, a defect address signal of a defect data line in the normal memory array: an address comparator circuit compares one defect address signal read from the redundancy memory circuit with an address signal generated by the address counter; and the count operation of the address counter is controlled by a coincidence signal generated by the address comparator circuit to substantially skip the defect address and relieve the defect data line.

BRIEF DESCRIPTION OF THE DRAWINGS

FIGS. 15A, 15B, and 15C are concept diagrams illustrating the erase operation of a flash memory according to an embodiment of the invention.

FIGS. 17A and 17B are concept diagrams illustrating the read operation of a flash memory according to an embodiment of the invention.

DETAILED DESCRIPTION OF THE PREFERRED EMBODIMENTS

Figure 1:
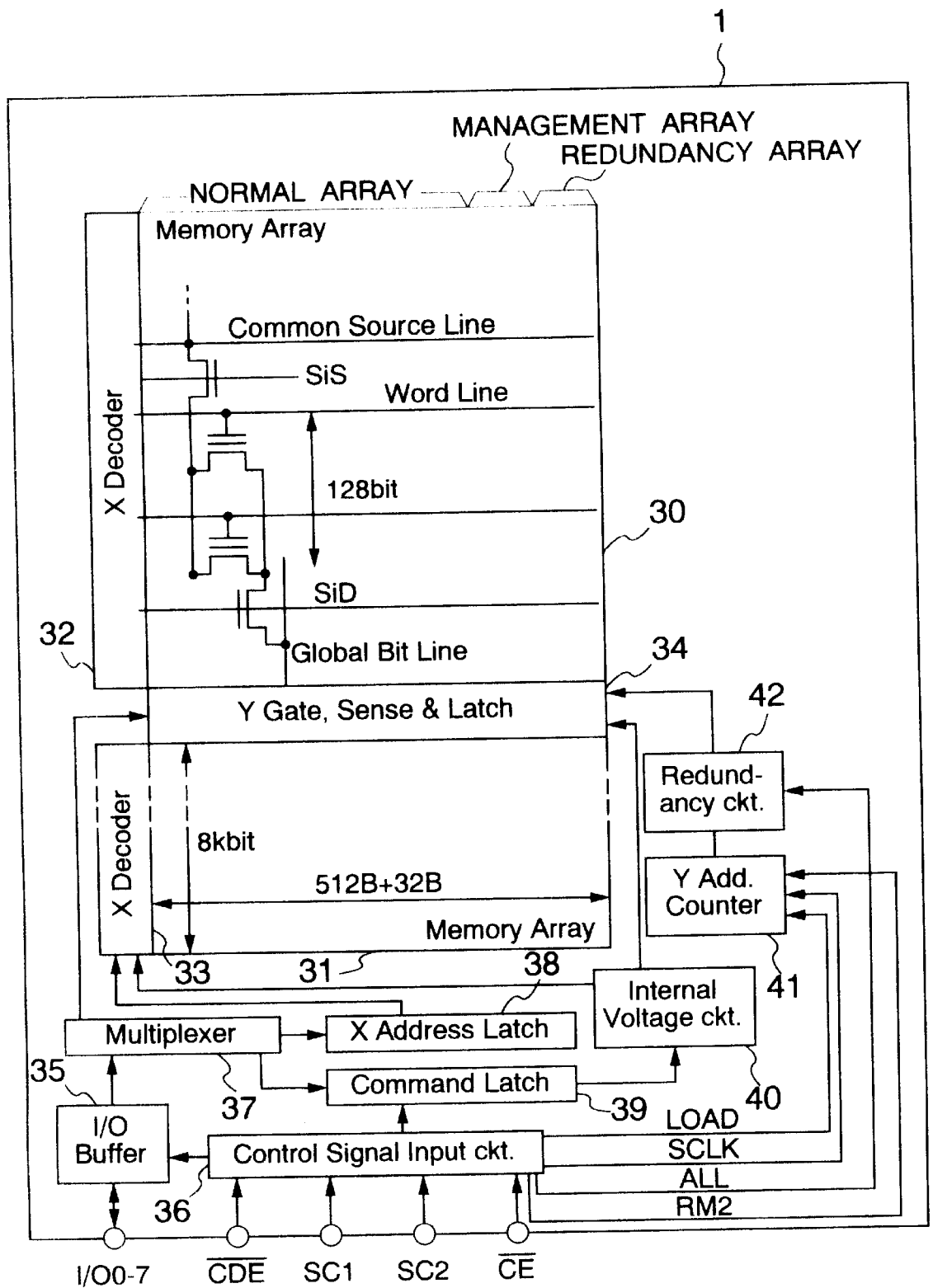
FIG. 1 is a block diagram showing the outline of a flash memory according to an embodiment of the invention.

FIG. 1 is a schematic block diagram of a flash memory 1 according to an embodiment of the invention. Each circuit block of the flash memory 1 is fabricated on a single semiconductor substrate such as single crystal silicon by well known manufacturing technologies for semiconductor integrated circuits.

Although not limitative, in this embodiment, a command for designating an operation mode and an X (row) address signal are input via data terminals I/O 0–7 in order to reduce the number of external terminals. Specifically, a signal input via an input/output (I/O) buffer 35 is supplied to a multiplexer 37 which distributes it to one of an X address latch 38, a command latch 39, and a column switch (Y gate) 34. On the memory array side of the column switch 34, a sense circuit with a latch function to be described later is provided. The input signal distribution is designated by a combination of a control signal /CDE and clock signals SC1 and SC2, respectively supplied to a control signal input circuit 36. A signal /CE is a chip enable signal which takes a low level to enable the operation of the flash memory.

An X address (sector address) signal latched by the X address latch 38 is supplied to X decoders 32, 33 which decode it to select one word line of the memory array 30 or 31. Although not limitative, in this embodiment, the Y gate 34 is shared by the memory arrays 30 and 31 and formed at the central area sandwiched by the memory arrays 30 and 31. The X decoders 32 and 33 each have an output circuit for outputting a select/non-select level in order to determine each voltage corresponding to each of the write, erase, read operation modes. This is done because the potential of a main word line SiD, connected to the gate of a select MOSFET to be described later, and the potential of the word line connected to the control gate of each storage transistor both change with each operation mode. Voltages necessary for these operation modes are generated by an internal voltage circuit 40.

In the memory arrays 30 and 31, a storage transistor is provided at each cross point of the word line and the data line (global bit line). Although not limitative, the data line is connected to the drains of a plurality of storage transistors via the select MOSFET. Similarly, the sources of these storage transistors constituting one block are connected to a common source line via another select MOSFET.

The memory arrays 30 and 31 each have a memory capacity of about 8 Kb (8 kilobits) in the X direction. Therefore, the number of word lines is 8192. Although not limitative, redundant word lines are added for the defect relief of word lines. The X address signal for selecting a word line is therefore constituted of 9 bits, X0 to X8. Since the X address signal is input to the data terminal I/O 0–7 as described earlier, two cycles are required to fetch the address signal X0 to X8.

A memory capacity of 512 B (byte)+32 B (byte) is set in the Y direction. As the data lines (bit lines), 512×8=4096 data lines are used for a normal array, 16×8=128 data lines are used for a management array, and 16×8=128 data lines are used for a redundant array. The management array and redundant array are not used for data storage. Therefore, the effective memory capacity of each of the memory arrays 30 and 31 is about 4M bytes (32M bits), and the flash memory has a large memory capacity of about 64M bits in total. The memory cells of the management array store information pertaining to the number of data write/erase times of each sector and information pertaining to a defect sector with a defect address.

The data line is connected to a sense amplifier. As stated earlier, the sense amplifier has a function of sensing a high level or low level of the data line and latching the sensed level. The sense amplifier therefore has a function of a register. Although not limitative, the sense amplifier may be a circuit similar to a CMOS sense amplifier used with a well known dynamic RAM. Namely, the sense amplifier is constituted of a pair of CMOS inverter circuits whose input and output are cross-connected and power switches for supplying an operation voltage and a ground voltage to the CMOS inverter circuits.

The sense amplifier is also used as a register for holding write data and connected to the data input/output line via a column switch 34. Specifically, in the read operation, data selected by the column switch 34 is transferred serially to the input/output buffer 35 via the input/output line and the multiplexer 37 and output from the data terminals I/O 0–7. In the write operation, data serially input from the data terminals I/O 0–7 is transferred to the input/output line via the input/output buffer 35 and multiplexer 37 and fetched via the column switch 34 by the sense amplifier serving as the latch circuit for the data line. This first stage data write operation is executed externally. After all write data is fetched, the data is transferred to corresponding data lines to write the data into memory cells. This operation is the second stage data write operation.

In accordance with a select signal obtained by decoding the address signal generated by a Y address counter 41, the column switch 34 connects the input/output nodes of the sense amplifier to the input/output line. A Y decoder for generating the select signal is assumed to be included in the column switch 34. A redundancy circuit 42 has a function to be described later, and replaces the a defective data line in the normal memory array by a reserved data line in the redundancy array. The address counter 41 counts the serial clock SC2 supplied from the external terminal and generates the Y address signal. The serial write data is input synchronously with the serial clock SC2, and the serial read data is output synchronously with the serial clock SC2.

The data terminals I/O 0–7 are used not only for data input/output but also for the input of a command designating the operation mode and of the X address signal, as described previously. The command or X address signal input from the I/O terminals is analyzed by a control logic circuit contained in the control signal input circuit 36 to generate timing signals and set potentials necessary for the operation.

In this embodiment, data erase, write, and read are executed in individual units of at least one word line used as one sector. It is therefore easy to use a mass storage controller such as a hard disk controller (HDC) and to configure a memory system. The flash memory of this embodiment is therefore compatible with a file memory such as a hard disk memory and can be easily used as such a file memory.

Figure 2:
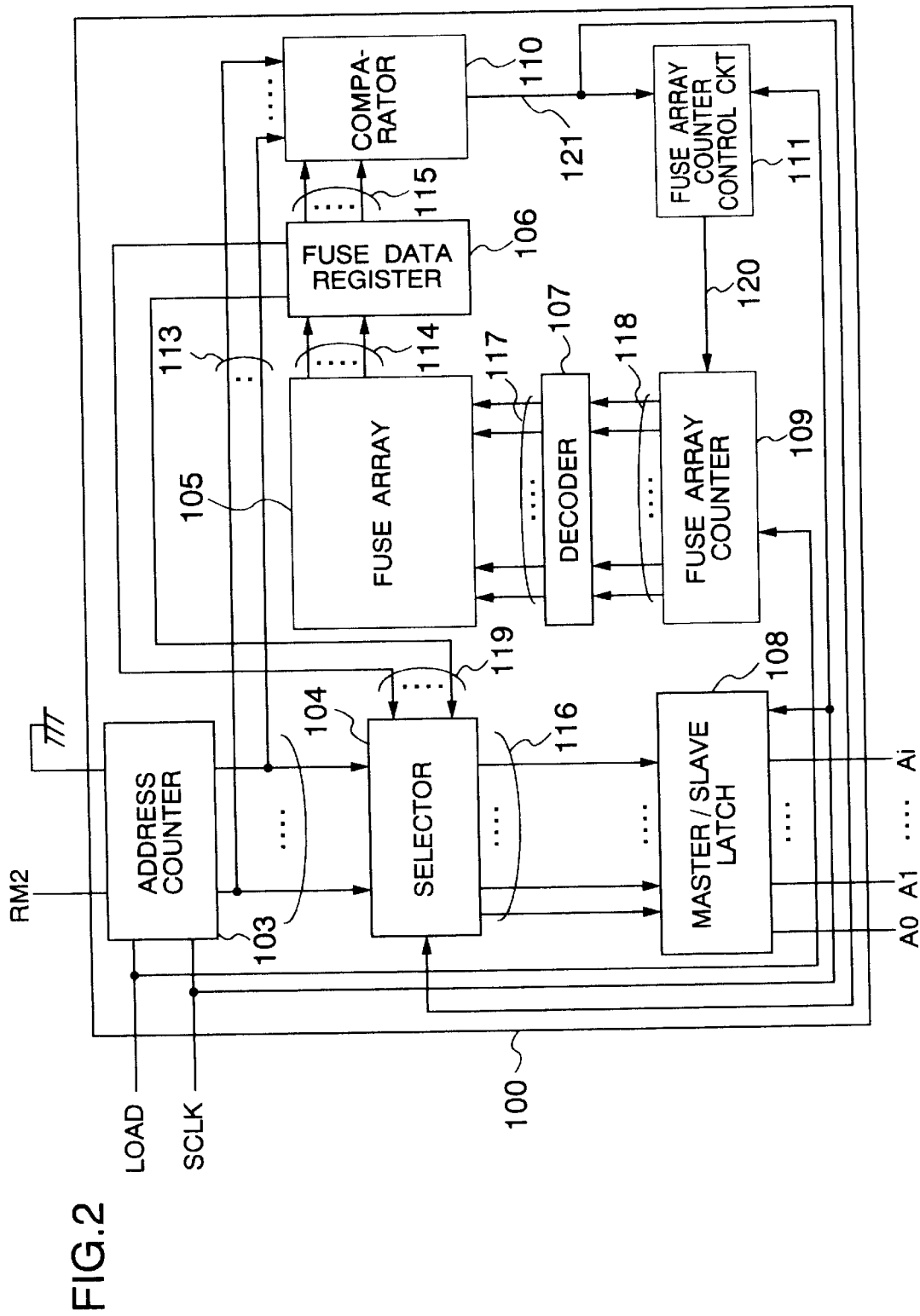
FIG. 2 is a block diagram showing a redundancy circuit according to an embodiment of the invention.

FIG. 2 is a block diagram of a redundancy circuit according to an embodiment of the invention. The redundancy circuit 100 of this embodiment corresponds to the redundancy circuit 42 and address counter 41 shown in FIG. 1. The address counter 103 shown in FIG. 2 corresponds to the address counter 41 of FIG. 1. The address counter 103 counts a serial clock signal SCLK generated by the control signal input circuit 36 to generate the Y address signal for serial access. For the management array and redundancy array, the address counter 103 is initialized when an initial value signal LOAD is supplied from the control signal input circuit 36. The initial value to be set is controlled by a mode switching signal RM2 supplied from the control signal input circuit 36. This mode switching signal RM2 is supplied to the address counter 103 constituted of a 10-bit binary counter at the highest bit data input terminal thereof, and the other 9-bit data input terminals are fixed to ground potential. Specifically, if the mode switching signal RM2 is low level, the address counter 103 is set with "0000000000" to sequentially access the normal array from address "0", whereas if the mode switching signal RM2 is high level, the address counter is set with "1000000000" to sequentially access the management array from address "512".

A fuse array 105 is a memory circuit for storing a defect address and a redundancy Y address. The fuse array 105 stores sixteen pairs of defect addresses and redundancy Y addresses corresponding to the number of data lines of the redundancy array. The defect data lines at the maximum of 16 data lines are stored sequentially in accordance with the select order of the normal array from "0" to "511". The redundancy Y address of the redundancy data lines is not required to have such regularity, but any one of 16 redundancy data lines may be designated.

A fuse array counter 109 is constituted of a 4-bit binary counter because the fuse array 105 has sixteen pairs of storage data "0" to "15". The output 118 of the fuse array counter 109 is initialized to "10000", upon power-on or memory access. Therefore, in such a clear state before serial access, a decoder 107 receiving the counter output 118 of "0000" selects the first select line from sixteen select signals 117. Thus, the defect address of the data line corresponding to the smallest address number among the Y addresses of the normal array ("0" to "511") and management array ("512" to "527") is read from the fuse array 105 and set to a fuse data register 106.

An address comparator 110 compares the Y address signal 113 generated by the address counter 103 counting the serial clock SCLK with a defect address signal 115 read from the fuse data register 106. If the Y address signal 113 is coincident with the defect address signal 115, the comparator 110 outputs a signal 121 indicating a coincidence. This coincidence signal 121 is supplied to a fuse array counter control circuit 111 which supplies a count pulse 120 to the fuse array counter 109 to increment the count by "1". Therefore one output 118 of the fuse array counter 109 becomes "0001" so that the second select signal for the fuse array 105 is selected to read the defect address of the data line having the next smallest address number. Similarly, each time the coincidence signal is output, the defect address in the order of smaller address numbers is read from the fuse array 105 and loaded to the fuse data register 106.

The output signal 121 of the comparator 110 is also supplied to a selector 104. The address signal 113 generated by the address counter 103 and the redundancy address signal 119 output from the fuse array 105 are selectively input to a master/slave latch 108 via the selector 104. If the output signal 121 of the comparator 110 is the signal indicating non-coincidence, the selector 104 selects the address signal 113 generated by the address counter 103 and supplies it to the master/slave latch 108. If the output signal 121 of the comparator 110 is the signal indicating coincidence, the redundancy address signal 119 read from the fuse array 105 is supplied to the master/slave latch 108. Since the redundancy array has only sixteen sets (bytes) of reserved data lines, only the lower four-bit addresses are stored in the fuse array 105 in order to designate the reserved data lines. Although ten bits are required to designate a defect address of the normal array, it is sufficient if the skip destination address signal has four bits, so that the number of fuses can be reduced.

Specifically, the redundancy array is assigned Y addresses from "528" to "543". Therefore, only the lower four bits for designating the sixteen Y addresses are stored as the redundancy addresses in the fuse array 105, and the other upper six-bit addresses are fixed to ground potential or the power supply potential by a fixed signal generator unit provided at the outside of the fuse array 105 in such a manner that the input terminals of the selector 104 corresponding to the redundancy addresses are fixed to ground potential or the power supply potential.

The master/slave latch 108 generates the Y address signal A0–Ai which is supplied to the column switch 34 shown in FIG. 1. The master/slave latch 108 outputs the address signal A0–Ai to a Y decoder shown in FIG. 18 at the timing of a delay of one clock period from the count operation of the address counter 103. During this one clock period, the address signal is switched in accordance with the above-described address comparison operation. Therefore, reading the data line of the normal array and reading the defect data line replaced by the redundancy data line are sequentially and serially executed synchronously with the clock signal SCLK.

As will be understood from the above description, the defect relief method of this embodiment relieves the defect of the Y address in individual units of at least one byte. Therefore, if there is a defect bit on any one of all word lines of about 16 K, this defect bit becomes a subject to be relieved and the defect cell on even one word line is relieved. If the redundancy array is sufficient in capacity, there is no practical problem. However, if the redundancy array is not sufficient, such a defect is desired to be switched to a reserved word line. The defect relieve method of this embodiment is suitable for the case where a particular data line has a number of defect cells or the data line itself is electrically disconnected or shorted. Therefore, it can be said that this relief method is a practical relief method.

In this embodiment, the single comparator 110 can be used in common for the comparison with a maximum of sixteen defect addresses for the sixteen redundancy data lines. Therefore, this address comparator 110 made of exclusive logic circuits and the like can be simplified, and the area of the comparator occupying the redundancy circuit 100 can be reduced considerably and a compact chip can be realized. With the relief method of this embodiment, even if the redundancy array is made large in order to improve the relief efficiency, only one comparator 100 is used so that an increase of the occupied area can be suppressed.

Figure 19A:
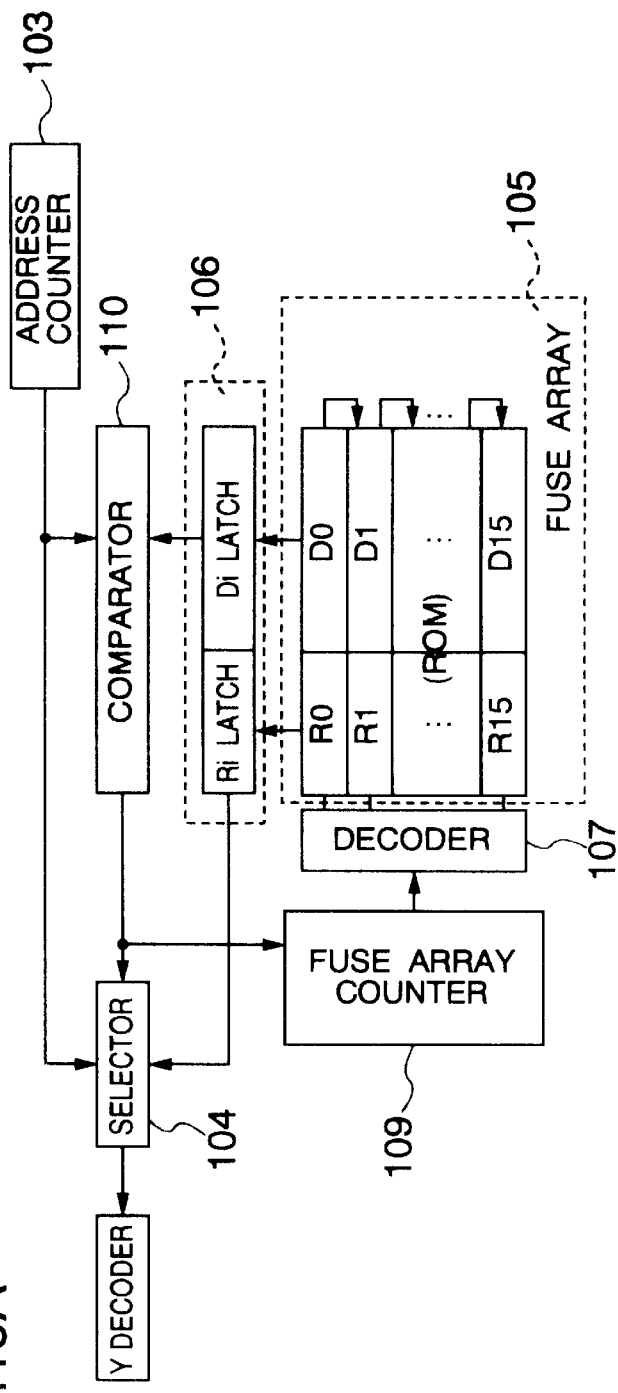
FIG. 19A is a diagram showing the structure of a redundancy circuit.
Figure 19B:
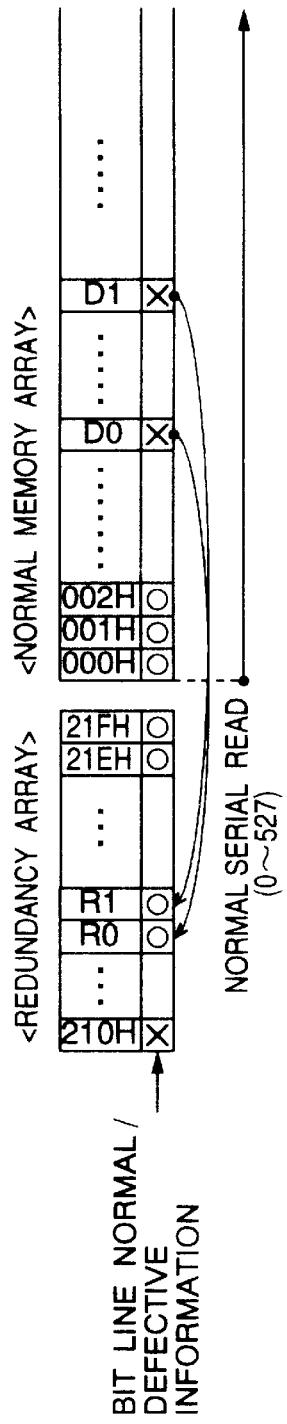
FIG. 19B is a concept diagram illustrating the operation of the redundancy circuit shown in FIG. 19A.

FIG. 19A is a block diagram of a redundancy circuit, and FIG. 19B is a concept diagram illustrating the operation of the redundancy circuit. Symbols "○" and "x" indicating whether the bit line is defective or not are shown in the normal memory array and redundancy memory array. The symbol "○" indicates that the data line is a normal data line, and the symbol "x" indicates that the data line is a defect data line. The data lines of the normal memory array are sequentially selected, for example, in the order of addresses 000H, 001H, 002H, . . . by the count operation of the address counter 103.

In a read only memory ROM of the fuse array 105, the defect address Dn in the normal memory array and its corresponding redundancy address Rn are stored. For example, assuming that the data line at an address D0 (D1, . . . , D15) in the normal memory array is a defect data line, the address R0 (R1, . . . , R15) of the data line in the redundancy memory area as the redundancy data line is stored in the read only memory ROM.

At the operation start of the flash memory, the defect address D0 and redundancy address R0 are read from the read only memory ROM and loaded in the fuse data register 106. The comparator 110 compares the count (address) of the address counter 103 with the defect address D0 in the fuse data register 106.

If the comparison results indicate non-coincidence, the comparator 110 outputs a non-coincidence signal to control the selector 104 so that the count of the address counter 103 is selected. The count is then supplied to the Y decoder shown in FIG. 18. As the comparator 110 outputs the non-coincidence signal, the count of the fuse array counter 109 is maintained unchanged so that the fuse data register 106 stores the previously set defect address D0 and redundancy address R0.

If the comparison results indicate a coincidence, the comparator 110 outputs a coincidence signal to control the selector 104 so that the redundancy address R0 in the fuse data register 106 is selected. The redundancy address R0 is then supplied to the Y decoder shown in FIG. 18 to relieve the defect data line in the normal memory array. As the comparator 110 outputs the coincidence signal, the count of the fuse array counter 109 is counted up by "1". This count is detected by the ROM decoder so that the next defect address D1 and redundancy address R1 are stored in the fuse data register 106.

Figure 3:
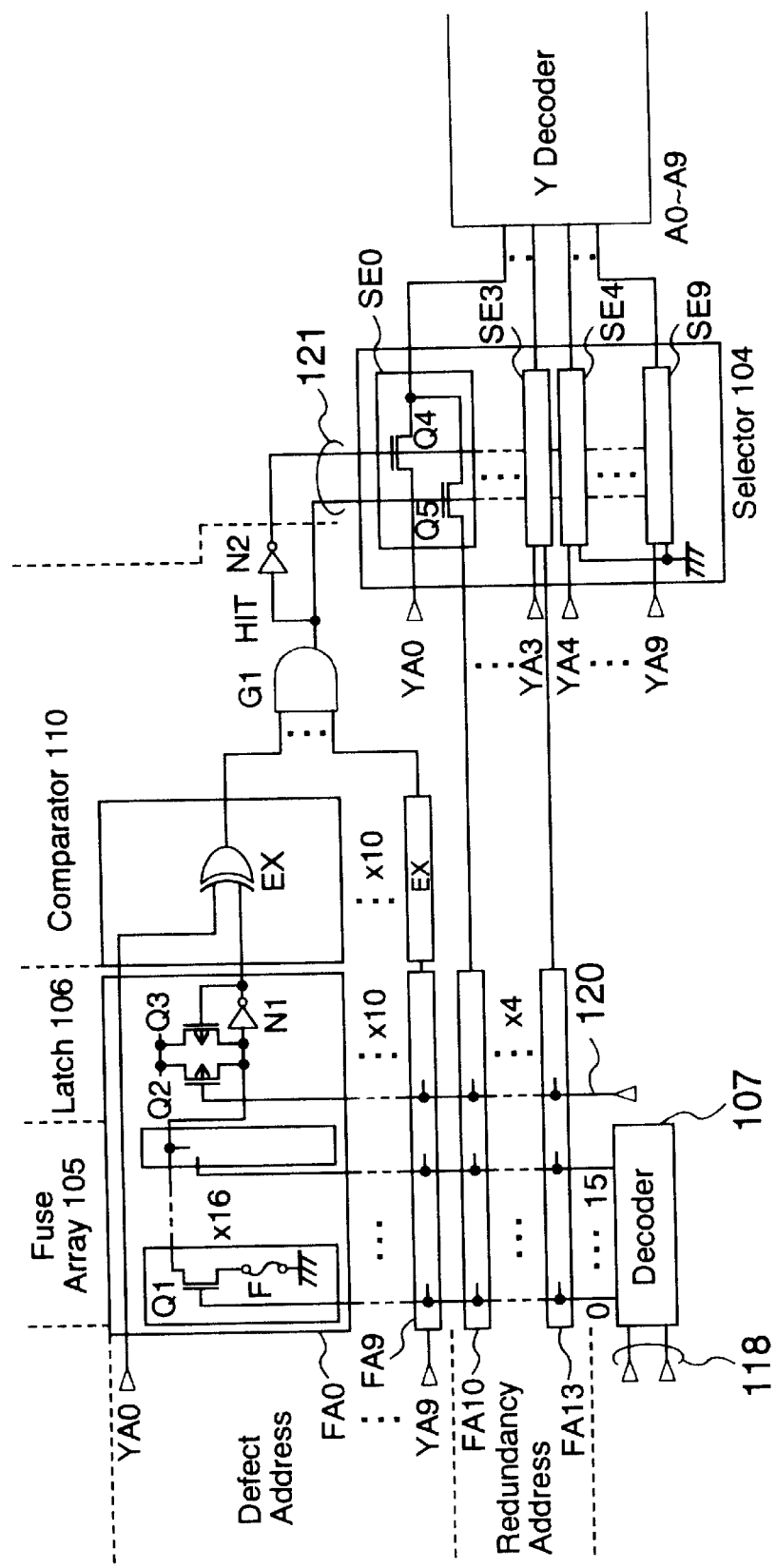
FIG. 3 is a block diagram showing the redundancy circuit of the embodiment shown in FIG. 2.

FIG. 3 is a block diagram of the redundancy circuit of the embodiment shown in FIG. 2. In FIG. 3, more specific circuits are shown by way of example in order to describe the invention more particularly. Each cell of the fuse array 105 is constituted of a fuse F and an n-channel select switch MOSFET Q1 serially connected to the fuse F. One end of the fuse F is connected to ground potential, and the other end is connected to the source of the n-channel select switch MOSFET Q1. The drain of MOSFET Q1 is connected in common to the drains of other similar MOSFETs assigned the same defect address, the interconnection thereof being used as the input line to the latch constituting the fuse data register 106.

Ten sets FA0 to FA9 of such fuses and select MOSFETs are provided in correspondence with the address signal YA0–YA9 generated by the address counter for relieving both the normal array and the management array. The gates of the select MOSFETs are connected in common to the select line 0–15 of the decoder 107. Memory circuits FA10 to FA13 each constituted of similar fuses and select MOSFETs are provided for the lower four bits of the redundancy array in order to write redundancy addresses. The input lines connected to the select MOSFETs and the select lines connected to the gates of the select MOSFETs are disposed in a matrix to form the fuse array. Respective sets of FA0 to FA13 have the same configuration.

The input line is connected to a p-channel pre-charge MOSFET Q2. The gate of the pre-charge MOSFET is supplied with a pre-charge signal from the fuse array counter control circuit 111 shown in FIG. 2. A signal on the input line is supplied to the input terminal of an inverter circuit N1. An output signal of the inverter circuit N1 is supplied to the gate of a feedback p-channel MOSFET Q3 connected between the input terminal and the power supply terminal of the inventer circuit N1. A high level of the select signal line turns on the select MOSFET Q1.

In this case, if the fuse F is not being cut, the input line is discharged from the high level to the low level by the pre-charge. The inverter circuit N1 generates an output signal of high level because of the low level on the input line. If the fuse F is being cut, the input line remains at high level and the output signal of the inverter circuit N1 takes a low level. Therefore, the feedback MOSFET Q3 is turned on so that the pre-charge level is maintained and latched. Namely, the feedback MOSFET Q3 prevents the input line from entering a floating state by the cut-off of the fuse F, and latches the input signal of high level.

The defect address signal and the address signal YA0 generated by the address counter are input to the exclusive logical OR circuit EX of the comparator 110 which outputs comparison results. If the exclusive logical OR circuit EX generates a coincidence signal of high level for all bits of the address signal YA0–YA9, an AND gate circuit G1 forms a coincidence signal HIT of high level. The coincidence signal HIT of high level turns on an n-channel MOSFET Q5 constituting the selector 104, so that the address signal of the lower four bits stored in the fuse array at the redundancy address is supplied to the Y decoder. The upper-bit address signal is fixed to the ground potential and set to "527" by the selector 104. Namely, by properly providing the inverter circuit, an address signal corresponding to "527" can be generated.

If the exclusive logical OR circuit EX generates a non-coincidence signal of low level for any one bit of the address signal YA0–YA9, the And gate G1 outputs the signal HIT of low level. This signal HIT of low level turns on the n-channel MOSFET Q4 constituting the selector 104, so that the address signal YA0–YA9 generated by the address counter is supplied to the Y decoder shown in FIG. 18 to execute the select operation of the data line in the normal array. Sets SE0 to SE9, each formed by the MOSFETs Q4 and Q5, forming the selector 104 are provided in correspondence to the address signals YA0 to YA9, respectively, and have the same configuration.

Figure 4:
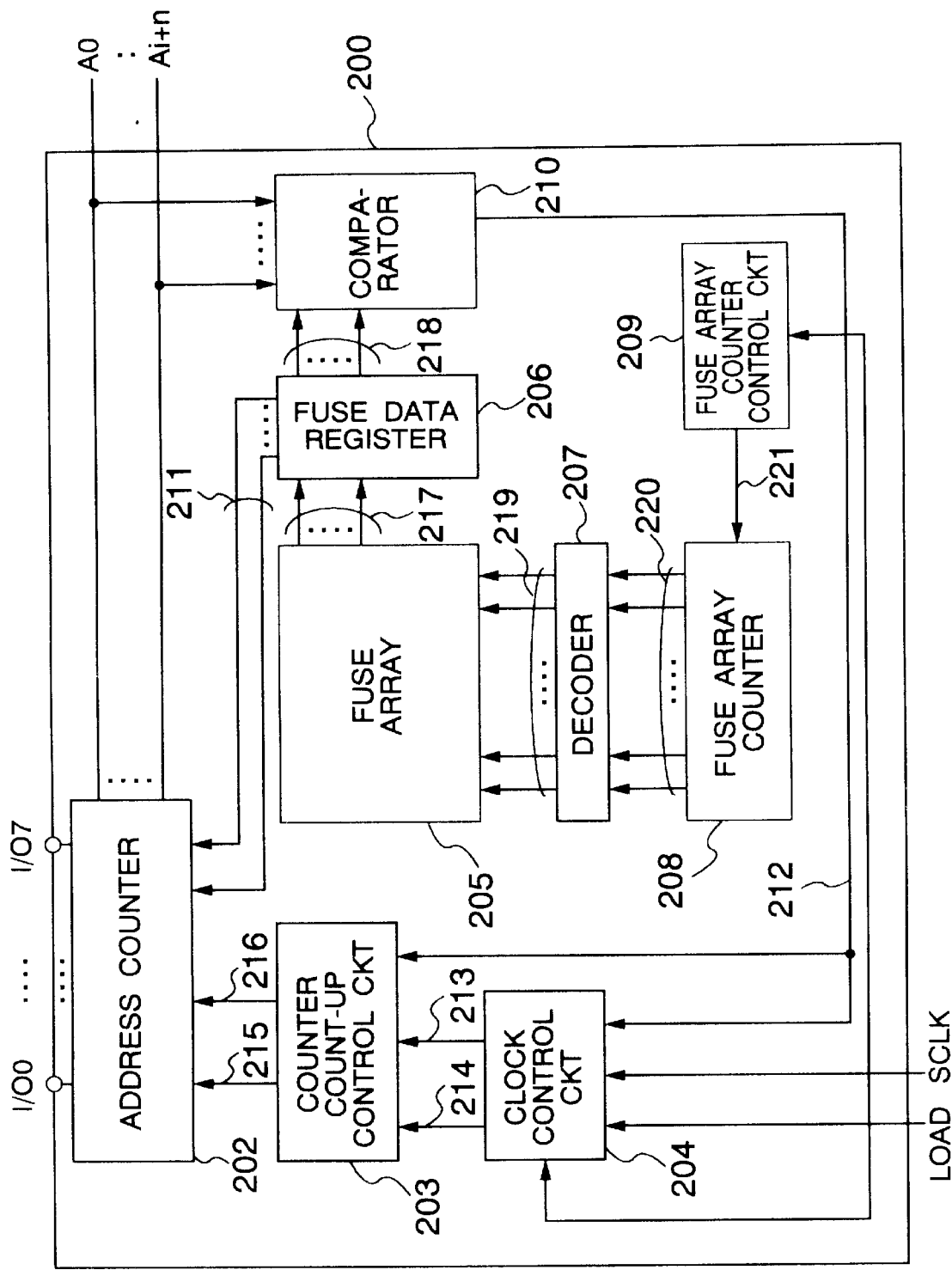
FIG. 4 is a block diagram showing a redundancy circuit according to another embodiment of the invention.

FIG. 4 is a block diagram showing the redundancy circuit according to another embodiment of the invention. For the redundancy circuit 200 of this embodiment, the memory array is not distinctly divided into the normal array and redundancy array. With the relief method of this embodiment, one memory array is provided without discriminating between the normal and redundancy arrays. The whole memory array has data lines for those of the normal array and for those of the redundancy array. If a defect data line is found during serial access, this defect data line is skipped and the next data line is selected. If the next data line is also a defect line, this data line is also skipped. The normal data line is selected after all defect data lines are skipped.

In this embodiment, for skipping a defect data line, a fuse array 205 stores a skip destination address. A fuse array 205, a decoder 207, a fuse array counter 208, a fuse data register 206, and a comparator 210 are similar to the corresponding circuits of the embodiment shown in FIG. 3. An address counter 202 is provided with an input function by which the skip destination address is skipped. In this embodiment, a clock control circuit 204 and a counter count-up control circuit 203 sequentially perform a count operation synchronously with the serial clock SCLK.

Although not limitative, as a defect address stored in the fuse array 205, an address one address before the defect address is used. Therefore, if a defect address 218 stored at the start address of the fuse array 205 coincides with the address signal $A0-A_{i+n}$ generated by the address counter 202, the data line is selected by using this address signal $A0-A_{i+n}$. Along with this operation, the comparator 210 detects a coincidence with the defect address, and the skip destination address stored in the fuse array 205 is set to the address counter. In this manner, by skipping the defect data line next to be selected, the address signal $A0-A_{i+n}$ of the normal data line can be generated. Similarly, a maximum of sixteen of the paired defect data lines can be relieved.

Figure 18:
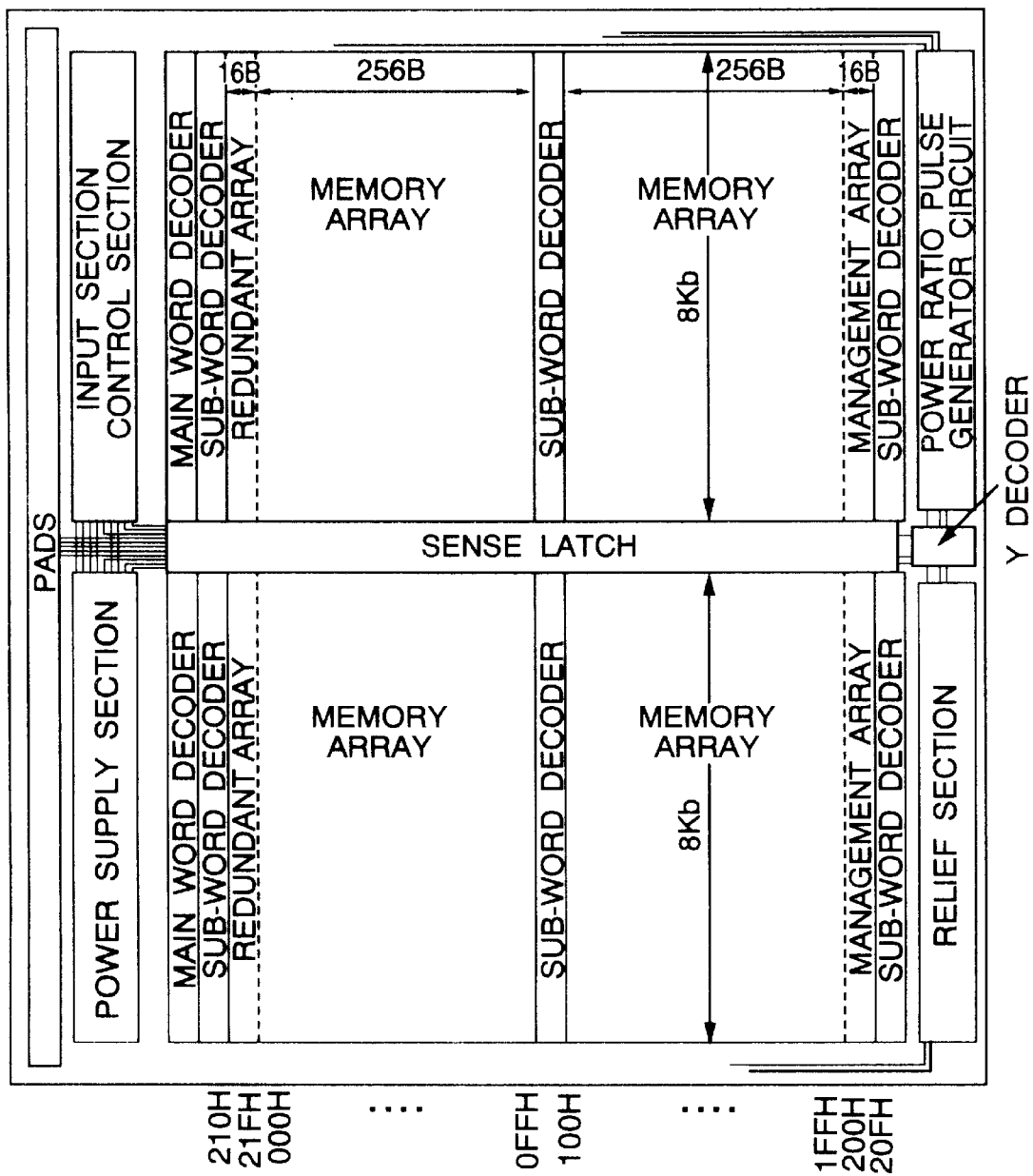
FIG. 18 shows a brief layout of a flash memory according to an embodiment of the invention.

If the address signal $A0-A_{i+n}$ generated by the address counter 202 is supplied via the master/slave latch circuit to the Y decoder shown in FIG. 18 so that the column switch select operation is executed with a delay of one clock period, then the memory array 205 stores the defect address and its corresponding redundancy address. Each time the defect address coincides, the defect address is skipped even if there are a plurality of consecutive defect data lines, to thereby select the normal data line. In this embodiment, even if there are a plurality of consecutive defect data lines, these can be relieved by using only one defect address so that the use efficiency of the fuse array can be improved.

In this embodiment, it is not necessary to make the number of defect addresses stored in the fuse array coincide with the number of data lines reserved in the memory array. It is rather preferable to set the number of reserved data lines to be more than the number of defect addresses. The reason for this is that if data lines of two bytes are skipped by one defect address, it becomes necessary for the memory array to have additional data lines of two bytes. Furthermore, since the normal data line and redundancy data line are not discriminated, the defect data line near the last address which is substantially considered as the redundancy data line can be relieved if there is, at the larger address, only one data line which can be replaced.

The fuse array 205 is not necessarily required to store the skip destination address. The clock control circuit 204 and count-up control circuit 203 may operate to increment the count of the address counter 202 by "1" in response to the coincidence signal and skip the address select operation for the defect data line.

Figure 5:
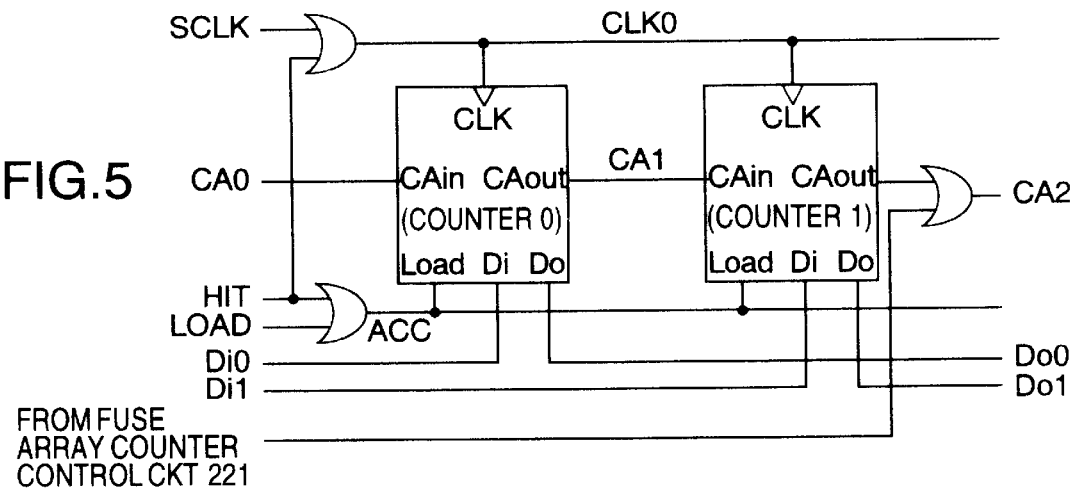
FIG. 5 is a schematic block diagram showing an embodiment of an address counter used by the redundancy circuit shown in FIG. 4.

FIG. 5 is a schematic block diagram showing an embodiment of the address counter 202 and counter count-up control circuit 203 used by the redundancy circuit of the embodiment shown in FIG. 4. In FIG. 5, the counter circuit of the lower two bits is illustratively shown. This embodiment uses a method such as a skip destination address replacement method. A load signal LOAD of the address counter is controlled by an ACC signal which is a logical sum (HIT+LOAD) of the coincidence signal HIT of the address counter count-up control circuit and the load signal LOAD, and the skip destination address signal 221 read from the fuse array is replaced by the count of the address counter to count up the address when the defect data line is selected.

Figure 6:
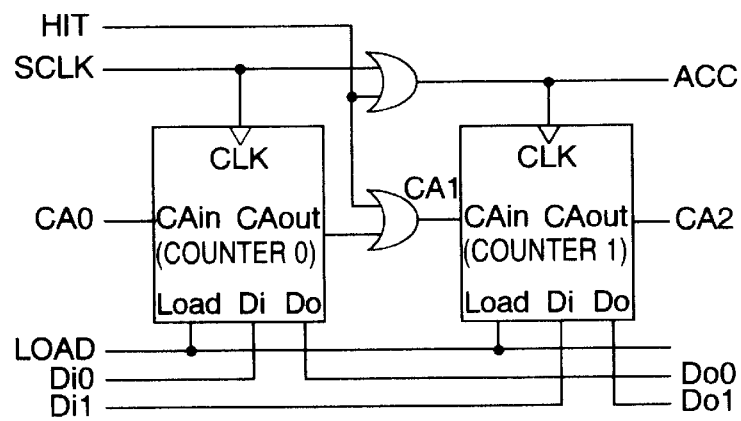
FIG. 6 is a schematic block diagram showing another embodiment of an address counter used by the redundancy circuit of this invention.

FIG. 6 is a schematic block diagram showing another embodiment of the address counter 202 and counter count-up control circuit 203 used by the redundancy circuit of this invention. Also in FIG. 6, the counter circuit of the lower two bits is illustratively shown. This embodiment uses a method such as an address counter clock signal control method. A clock signal SCLK of the address counter is controlled by the ACC signal which is a logical sum (HIT+SCLK) of the coincidence signal HIT of the address counter count-up control circuit and the clock signal SCLK, to thereby count up the address. In this embodiment, although not limitative, a skip number corresponding to the number of consecutive defect data lines is read from the fuse array, and corresponding N HIT signals are generated to count up the address when the defect data line is selected.

Figure 7:
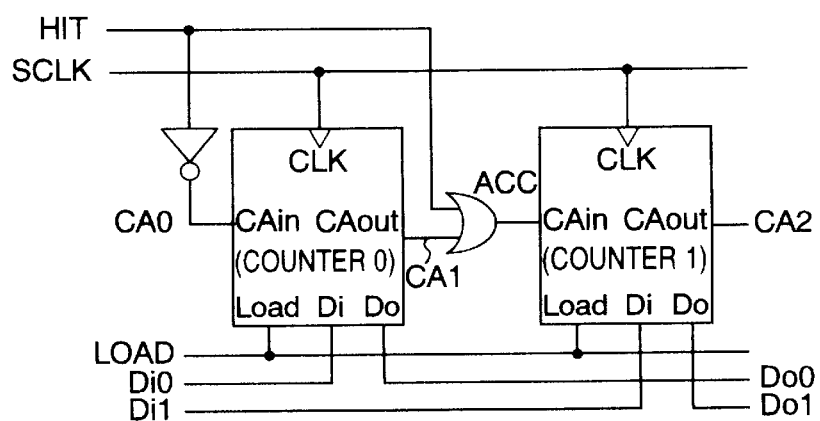
FIG. 7 is a schematic block diagram showing a further embodiment of an address counter used by the redundancy circuit of this invention.

FIG. 7 is a schematic block diagram showing a further embodiment of the address counter 202 and counter count-up control circuit 203 used by the redundancy circuit of this invention. Also in FIG. 7, the counter circuit of the lower two bits is illustratively shown. This embodiment uses a method such as an address counter carry signal control method. The ACC is generated by a logic OR circuit inputting a carry signal CA1 and the coincidence signal HIT of the address counter count-up control circuit, to thereby count up the address. In this embodiment, although not limitative, the fuse array is not necessary to store the skip destination address, but the HIT signal counts up the address by "1" unconditionally to select the data line at the next address.

Figure 8A:
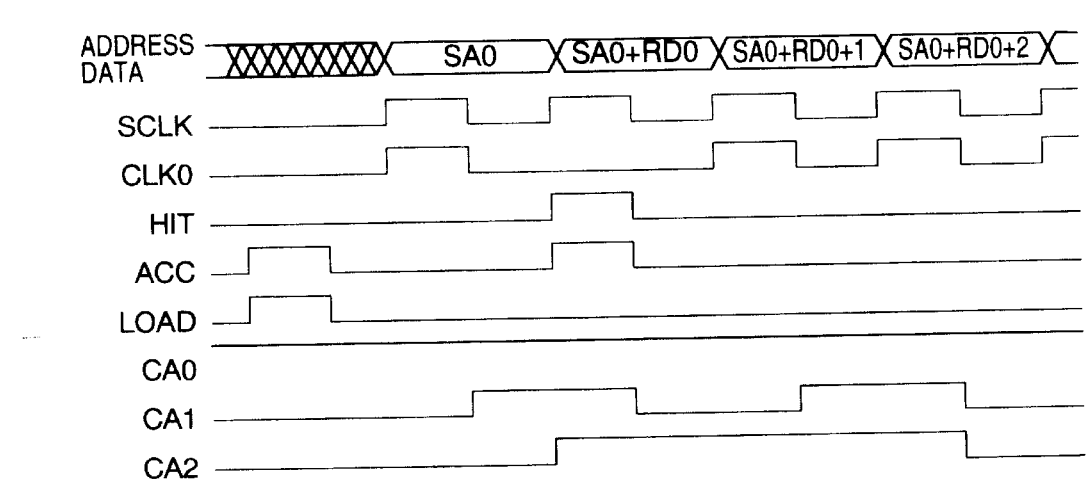
FIGS. 8A, 8B, and 8C are timing charts illustrating the operation of the redundancy circuits shown in FIGS. 5 to 7.
Figure 8B:
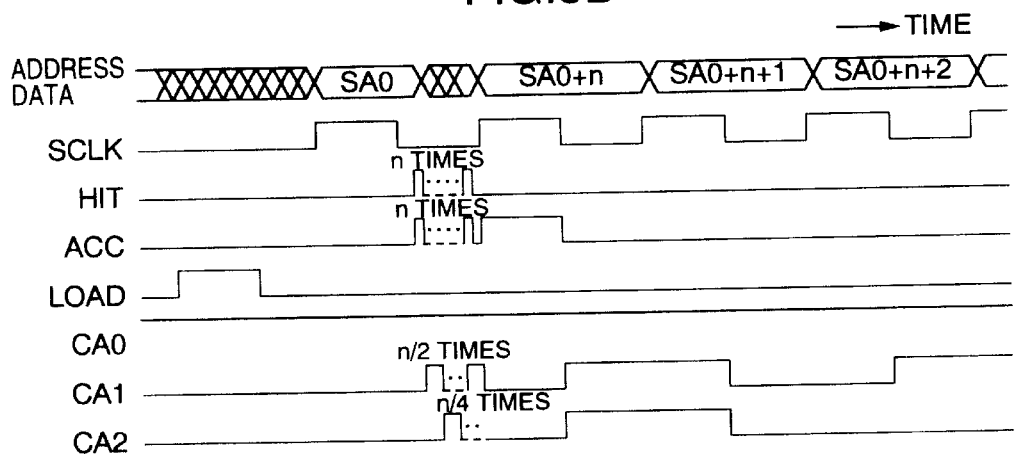
Figure 8C:
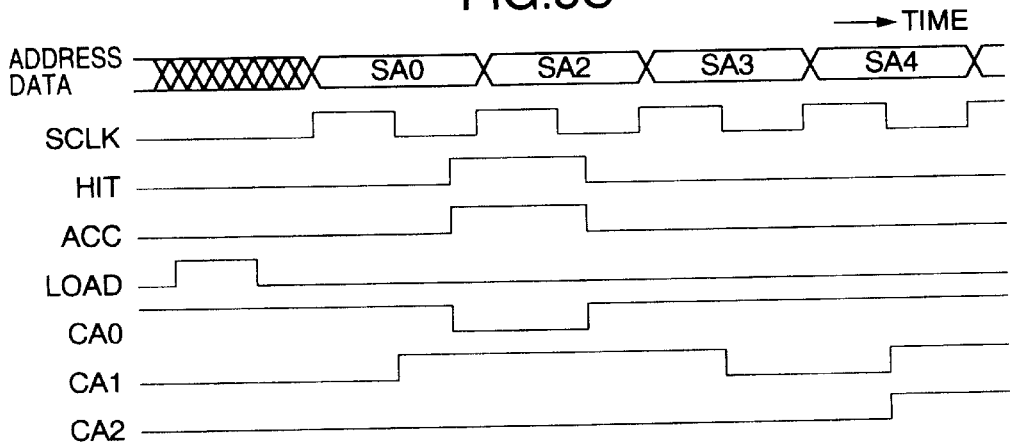

FIGS. 8A to 8C are timing charts illustrating the operation of the address counters used by the redundancy circuits shown in FIGS. 5 to 7. FIG. 8A illustrates the skip destination address replacement method corresponding to FIG. 5. If the defect address is at SA1, the address data of the address counter is replaced by an address SA+RD0 corresponding to the skip destination address 221 read from the fuse array.

FIG. 8B illustrates the address counter clock signal control method corresponding to FIG. 6. By N HIT signals, the address data of the address counter is skipped from SA0 to $SA_{0+n}$. FIG. 8C illustrates the address counter carry signal control method corresponding to FIG. 7. The HIT signal counts up the address by "1" and the address data of the address counter is changed from SA0 to SA2 by skipping the defect address SA1.

Figure 9:
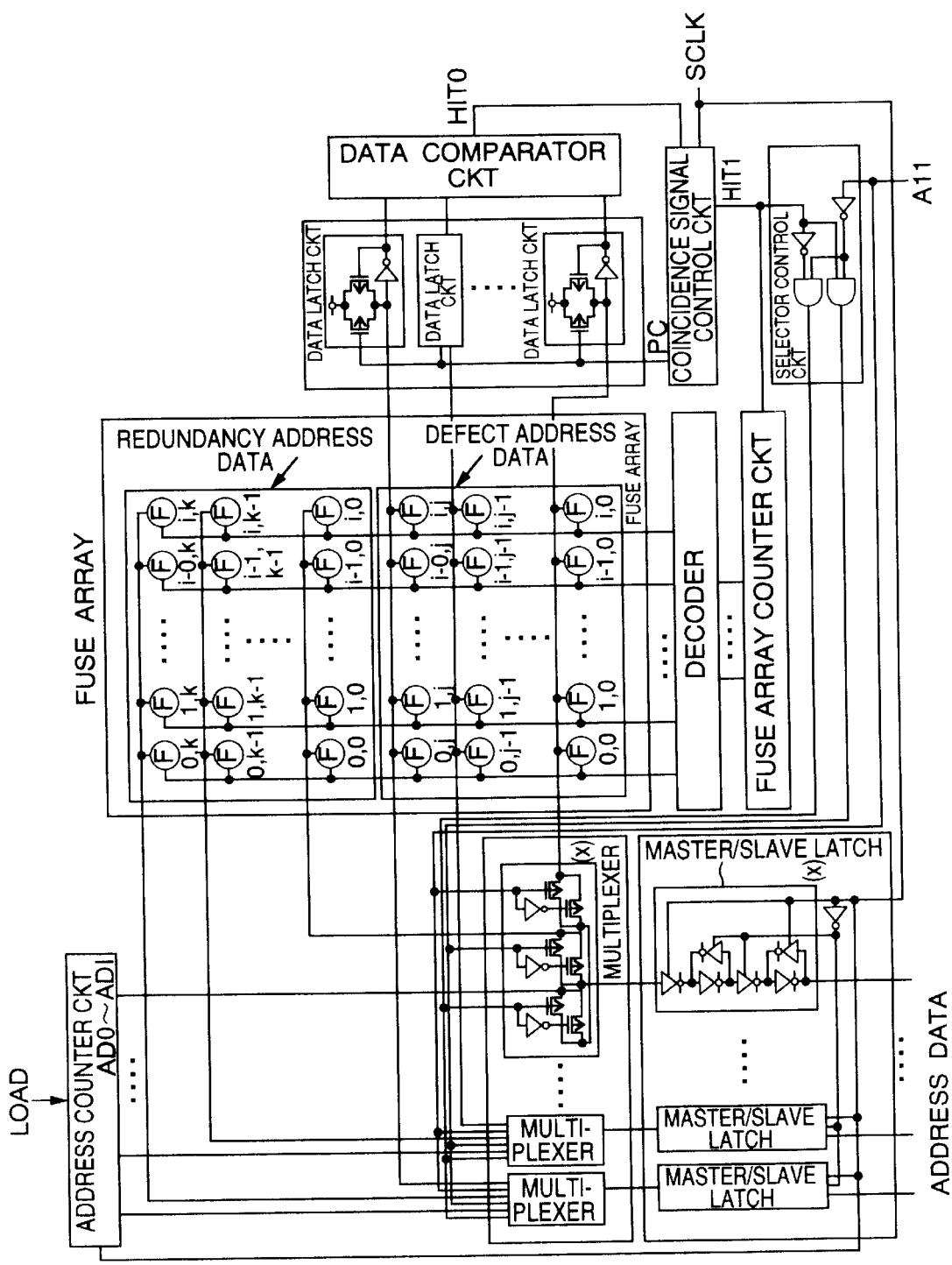
FIG. 9 is a block diagram showing a redundancy circuit according to another embodiment of the invention.

FIG. 9 is a block diagram showing the redundancy circuit according to another embodiment of the invention. In FIG. 9, more specific circuits are shown by way of example in order to describe the invention more in particularly. The fuse array is constituted of cells F disposed in a matrix, each cell F being formed by a fuse and an n-channel select switch MOSFET as described previously. This embodiment is basically the same as the embodiment shown in FIG. 3. However, as the selector shown in FIG. 3, a three-input multiplexer made of CMOS switches is used to allow the defect address in addition to the skip destination address to be read from the fuse array.

With this additional function, the address signal read from the redundancy circuit 42 shown in FIG. 1 can be directly transferred via the multiplexer 37 to the input/output buffer 35 to read the defect address from the data terminals. As in the above embodiment, if the defect address is made of 10 bits and the data terminals are made of 8 bits, the address is output by two cycles. In order to perform such an operation mode, a defect address read command is provided.

Figure 10:
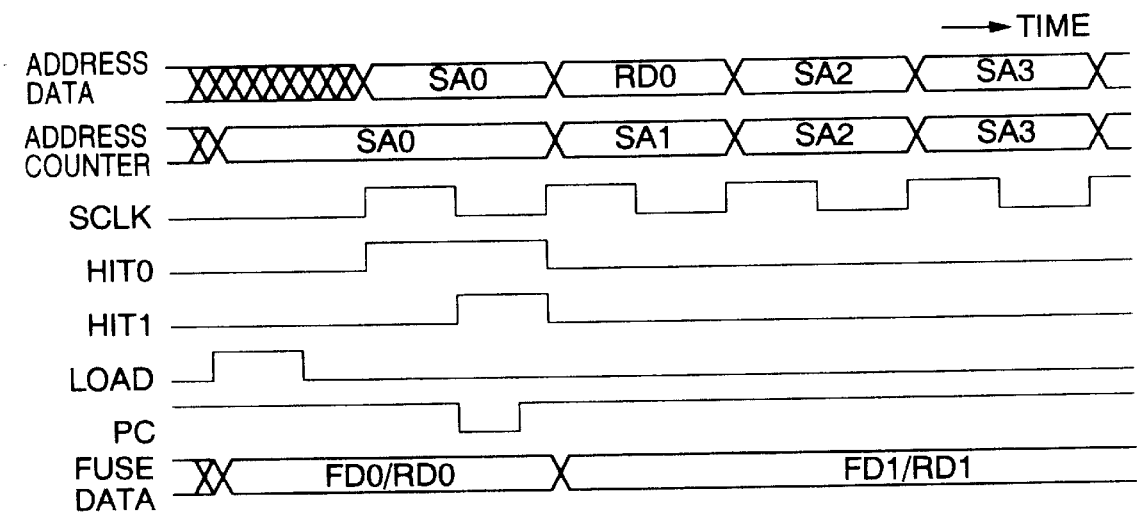
FIG. 10 is a timing chart illustrating the operation of the redundancy circuit shown in FIG. 9.

FIG. 10 is a timing chart illustrating an example of the operation of the redundancy circuit shown in FIG. 9. At the start of memory access, the load signal LOAD is generated, the address counter is cleared, and the start address SA0 is set. Similarly, the first defect address and skip destination address FD0/RD0 are read from the fuse array. In this embodiment, as the defect address FD0, an address one address before the actual defect data line is stored.

In response to the serial clock SCLK, the column switch select operation is performed using the address data SA0 to read the first byte data. At this time, since the address data SA0 and the defect address FD0 coincide with each other, the HIT signal of high level is output so that it can be judged that the defect data line is at the next address SA1. Therefore, the coincidence signal HIT1 is output during the low level period of the clock SCLK and the fuse array counter circuit counts up by "1". Synchronously with this, the pre-charge signal PC is made low level and the fuse array is reset.

As the clock signal SCLK is made high level, the selector selects the skip destination address RD0 in place of the count SA1 of the address counter and outputs it as the address data. Therefore, the data line at the address RD0 in the redundancy array is selected in place of the address SA1 in the normal array synchronously with the second clock SCLK to thereby output the second one byte data. Synchronously with this, the second defect address FD1 and its corresponding skip destination address RD1 are output from the fuse array.

If there is any defect data line after the third address SA2, the coincidence signal is not generated. Therefore, the addresses SA2 and SA3 generated by the address counter are output to sequentially select the data lines of the normal array and serially output data in individual units of a byte.

Figure 11:
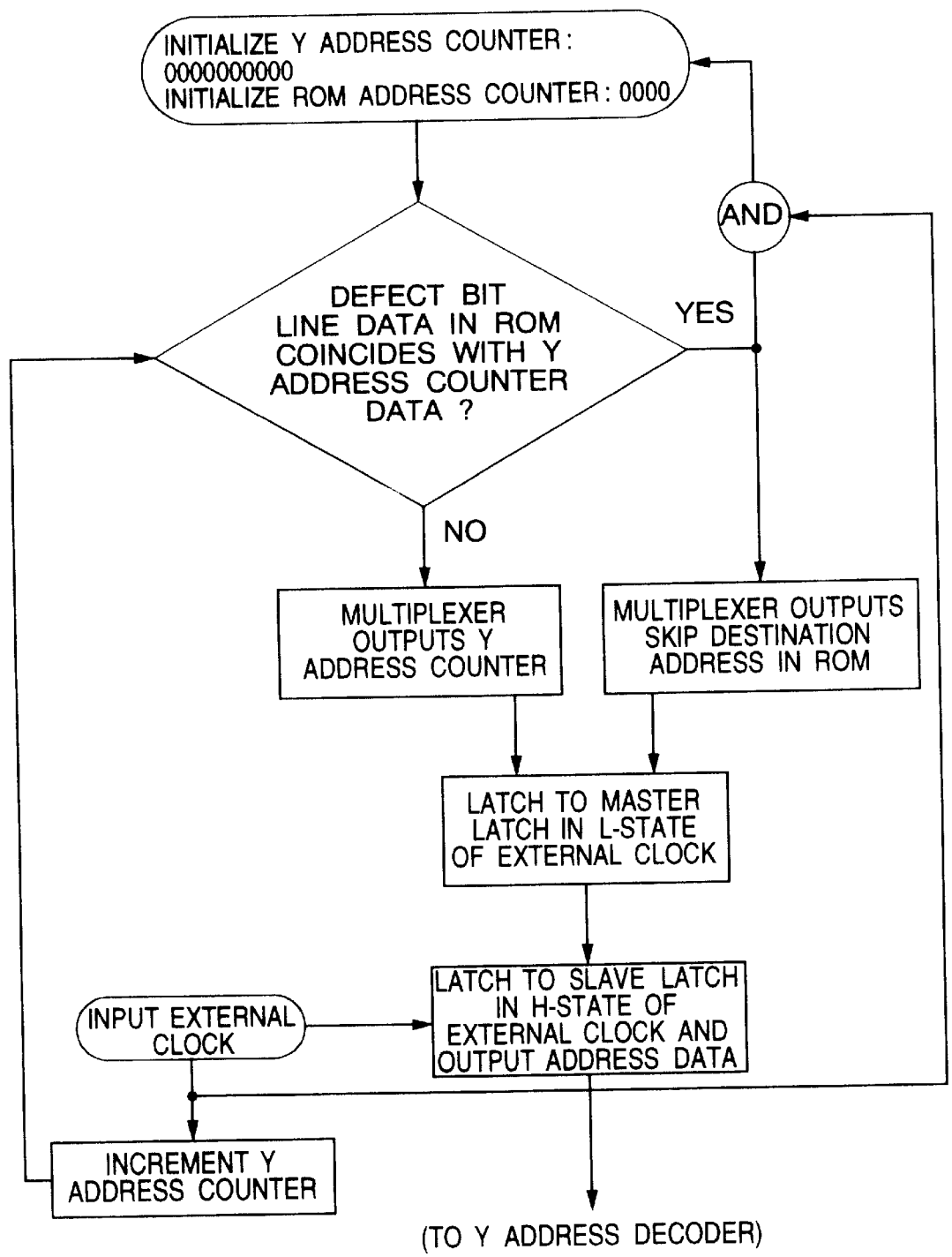
FIG. 11 is a flow chart illustrating an operation of a redundancy circuit of the invention, the operation basing upon a skip destination address replacement method.

FIG. 11 is a flow chart illustrating an operation of the redundancy circuit of this invention using the skip destination address replacement method. The flow chart of FIG. 11 corresponds to an access to the normal array. For the read/write operation, the Y address counter 103 and the ROM (fuse array) address counter 109 are initialized. If the data (address) of the defect bit line (data line) of ROM does not coincide (No) with the data (address) of the Y address counter, the multiplexer selects the Y address counter which is latched to the master latch while the external clock signal is low level (L) or to the slave latch while it is high level (H) to thereby output the address data. The external clock signal increments (counts up) the Y address counter. If the data of the defect bit line of ROM does not coincide (N0) with the data of the Y address counter, an operation similar to that described above is repeated.

If the data of the defect bit line of the ROM coincides (Yes) with the data of the Y address counter, the multiplexer outputs the skip destination address of the ROM which is latched to the master latch while the external clock signal is low level (L) or to the slave latch while it is high level (H) to thereby output the address data. Along with the replacement operation of the defect data line, the external clock signal increments (counts up) the Y address counter to skip the defect address. The count operation of the ROM (fuse array) counter circuit is performed in response to the logical product (AND) of the coincidence signal and external clock signal so that the next defect address and skip destination address are read from the ROM.

Figure 12:
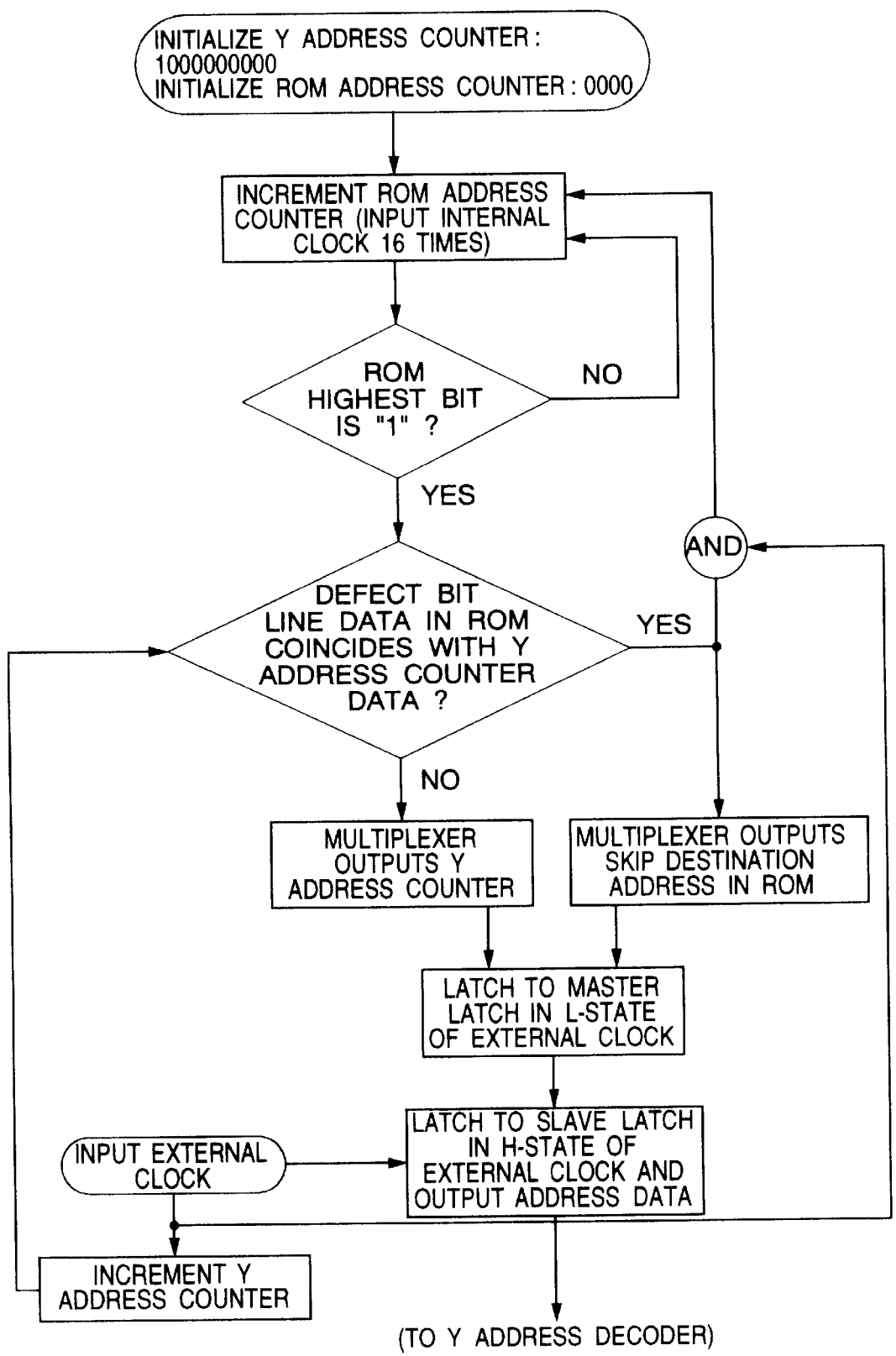
FIG. 12 is a flow chart illustrating another operation of a redundancy circuit of the invention, the operation basing upon a skip destination address replacement method.

FIG. 12 is a flow chart illustrating another operation of the redundancy circuit of this invention using the skip destination address replacement method. The flow chart of FIG. 12 corresponds to an access to the management array. For the access to the management array, the highest bit of the Y address counter is set with "1". The operation of setting "1" to the highest bit is performed by inputting a command which designates a mode of accessing the management array. Namely, the address "512" is not input externally, but a signal "1" obtained by decoding the command is set to the highest address bit. The ROM (fuse array) address counter is initialized since it is not certain as to which address corresponds to the smallest address corresponding to the management array.

In order to make the data (address) of the defect bit line (data line) of the ROM correspond to the management array, the redundancy circuit executes a dummy cycle. Namely, the coincidence signal HIT is forcibly generated to judge whether the highest bit of the defect address read from the ROM is "0" or "1". If it is judged that the highest bit is "0" (No), this address is the defect address corresponding to the normal array, and the ROM address counter is counted up. If the highest bit is "0" after the count-up operation is repeated 16 times, it is judged that the management array has no defect data line. In this case, although the corresponding defect address and skip destination address are read, these addresses does not coincide with the addresses in the management array, and so they are not used practically.

If the highest bit of the defect address signal read from the ROM is judged to be "1" (Yes), the dummy cycle of the ROM is intercepted. The first address of the Y address counter initialized for giving a correspondence with the management array is compared with the defect address read from ROM. If the data (address) of the defect bit line (data line) of the ROM does not coincide (No) with the data (address) of the Y address counter, the multiplexer selects the Y address counter which is latched by the master latch while the external clock signal is low level (L) and by the slave latch while it is high level (H) to thereby output the address data. The external clock signal increments (counts up) the Y address counter. If the data of the defect bit line of the ROM does no coincide (N0) with the data of the Y address counter, an operation similar to that described above is repeated.

If an data of the defect bit line of the ROM coincides (Yes) with the data of the Y address counter, the multiplexer outputs the skip destination address of the ROM which is latched to the master latch while the external clock signal is low level (L) or to the slave latch while it is high level (H) to thereby output the address data. Along with the replacement operation of the defect data line, the external clock signal increments (counts up) the Y address counter to skip the defect address. The count operation of the ROM (fuse array) counter circuit is performed in response to the logical product (AND) of the coincidence signal and external clock signal so that the next defect address and skip destination address are read from the ROM.

Figure 13:
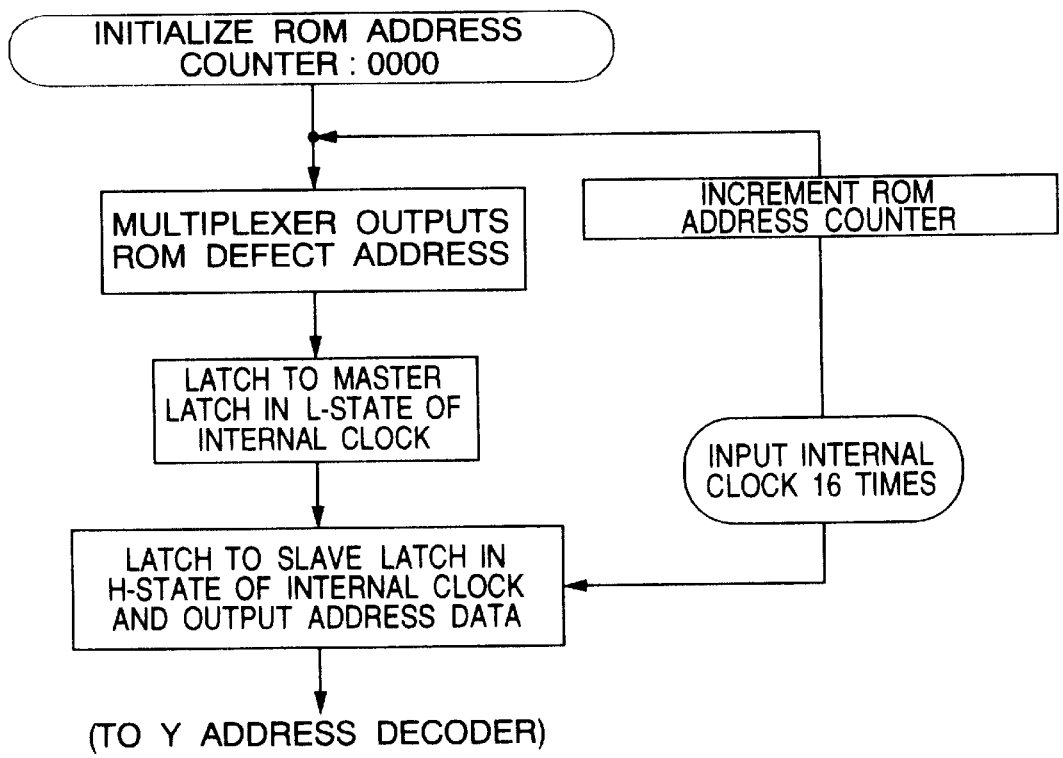
FIG. 13 is a flow chart illustrating the operation of the redundancy circuit shown in FIG. 9 for reading a defect address.

FIG. 13 is a flow chart illustrating the operation of reading a defect address by the redundancy circuit shown in FIG. 9. Similar to the above, the ROM address counter is initialized to the start address. The multiplexer outputs the defect address stored in the ROM which is latched by the master latch while the internal clock is low level (L) and by the slave latch while it is high level (H) to thereby output the address data. These operations of the ROM address increment and master/slave latch in response to the internal clock are repeated 16 times.

Figure 14:
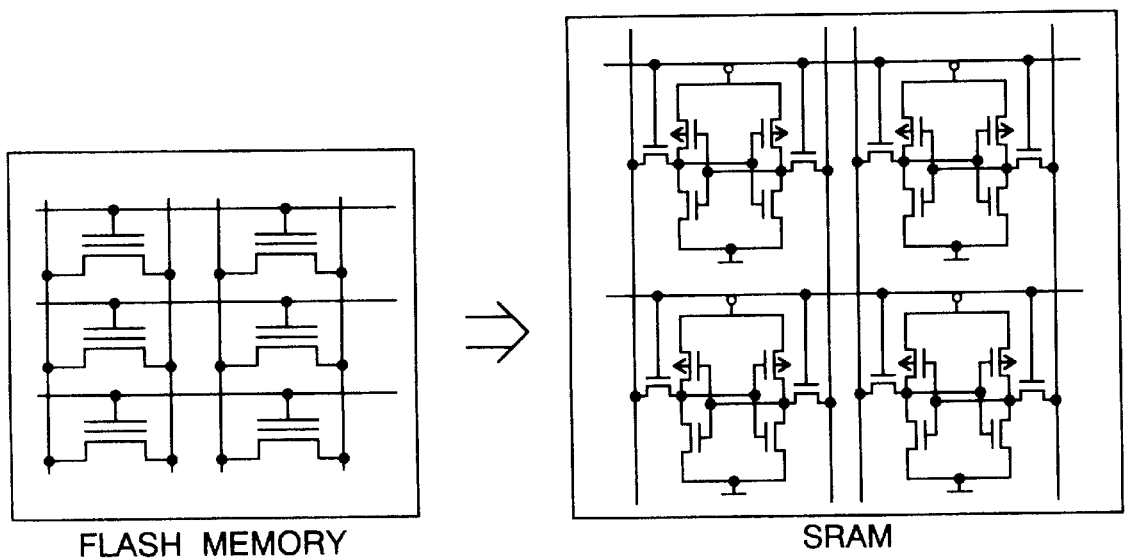
FIG. 14 is a schematic diagram showing the structure of a memory circuit used by a redundancy circuit according to another embodiment of the invention.

FIG. 14 is a schematic diagram showing the structure of a memory circuit used by the redundancy circuit according to an embodiment of the invention. In this embodiment, memory cells of a flash memory are used for the storage of a defect address and skip destination address. However, since the speed of reading the defect address synchronously with serial access is slow, the data in the flash memory is sequentially read immediately after power-on and transferred to a static RAM (SRAM). A static memory cell is constituted of two CMOS inverter circuits whose input and output are cross connected to form a latch type, and transfer gate MOSFETs for activating a pair of input/output nodes of the two CMOS inverter circuits to perform the input/output operation thereof. For serial access, the data is read from the SRAM so that replacement of a defect address can be executed at high speed and the defect data line can be relieved synchronously with the serial access.

Use of such a flash memory and SRAM increases the number of total device elements. However, the occupied area of the semiconductor chip does not increase appreciably. Namely, if a fuse array is used, an occupied area of one fuse is considerably larger than one MOSFET. Therefore, a small scale flash memory and SRAM for storing defect addresses and skip destination addresses of 16 pairs have an occupied area smaller than the fuse array.

FIGS. 15A to 15C are concept diagrams illustrating an erase operation of a flash memory according to an embodiment of the invention. FIG. 15A shows memory cell biases, FIG. 15B is a circuit diagram of a memory array circuit, and FIG. 15C shows an address space.

Referring to FIG. 15A, a storage MOSFET has a stacked gate structure in which a floating gate covers parts of the source and drain regions. A gate insulating film between the floating gate and a semiconductor substrate is made of a thin oxide film capable of permitting the flow of a tunnelling current therethrough. In an erase operation, a voltage of +Vg is applied to the control gate and a voltage of −Vw is applied to the substrate. A high electric field is therefore formed between the substrate and floating gate to allow a tunnelling current to flow therethrough so that electrons are injected from the substrate into the floating gate. As a result, in an erase state, the storage MOSFET is in an off-state relative to the select level of the word line. Although not limitative, during the erase operation, although the voltage of −Vw is applied across the source and drain, the erase operation itself is effected by the bias between the control gate and substrate.

Referring to the memory array circuit shown in FIG. 15B, a plurality of storage MOSFETs constitute one block and their drains and sources are connected in common. Between the common drain and data line, a select MOSFET is connected. In an erase operation, the source line and data line are both applied with the substrate potential −Vw. At this time, since the gate voltage of the select MOSFET is 0 V, this select MOSFET turns on and both the common drain and source of the storage MOSFETs of the block are −Vw. The control gate of the storage MOSFET is connected to the word line. The select MOSFETs are selected by a select line extending in parallel to the word line, and this select line may be called a main word line.

In the erase operation, the substrate Well is applied with a negative voltage such as −Vw (=−4V), and the word line is applied with a select voltage +Vg such as +12 V. Under this condition, a collective erase operation in individual units of a word line can be performed. In this embodiment, one word line is used as a storage unit such as one sector. One sector is constituted by 512 bytes, although this is not limitative. Specifically, one word line (not physically one line) is connected to 512×8≈4 K memory cells. In this case, if eight memory arrays are provided, the word line select operation can be performed at high speed even if a word drive having a relatively small current drive capability is used, because one word line is allocated 512 storage transistors.

Referring to FIG. 15C, in the memory space, a select signal of the word line is used as a sector address. Specifically, sectors 0–n are assigned in correspondence with the addresses of word lines and the erase operation is performed in individual units of such a sector. In this embodiment, an X address corresponding to each word line is input as a sector address.

Figure 16A:
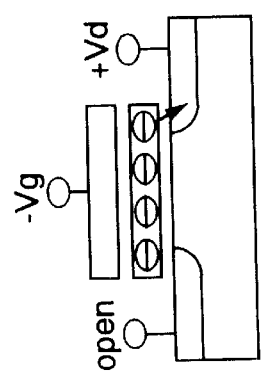
FIGS. 16A, 16B, and 16C are concept diagrams illustrating the write operation of a flash memory according to an embodiment of the invention.
Figure 16B:
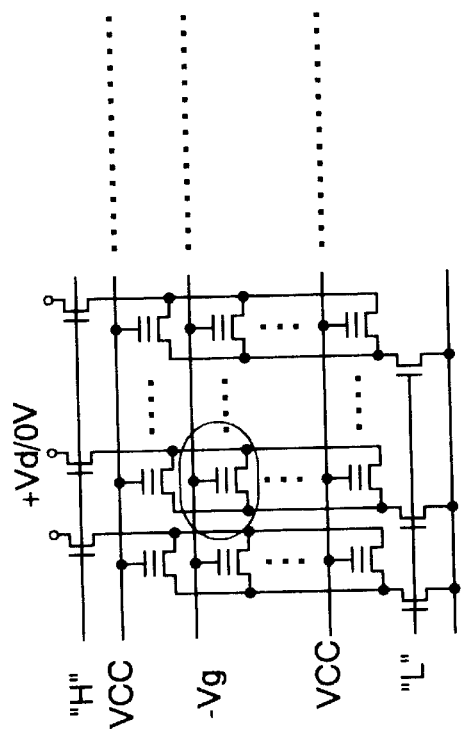
Figure 16C:
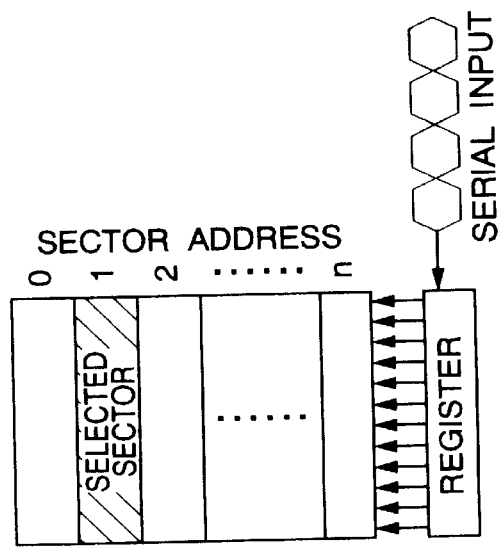

FIGS. 16A to 16C are concept diagrams illustrating a write operation of a flash memory according to an embodiment of the invention. FIG. 16A shows memory cell biases, FIG. 16B is a circuit diagram of a memory array circuit, and FIG. 16C shows an address space.

Referring to FIG. 16A, in a write operation, the control gate is applied with −Vg (−9.5 V) and the drain is applied with +Vd (4.5 V). A high electric field is therefore formed between the floating gate and drain to allow a tunnelling current to flow therethrough so that electrons are injected from the floating gate into the drain. The word line not selected is set to Vcc (+3 V) so that there is no substantial tunnelling current in the storage MOSFET applied with the drain voltage of +Vd and the write operation is not performed. The written storage MOSFET lowers its threshold voltage and turns on relative to the select level of the word line. During the write operation, the source is made open.

Referring to the memory array circuit shown in FIG. 16B, in the write operation, the gate of the select MOSFET on the common drain side of the storage MOSFETs is applied with a high level ("H") to turn on this select MOSFET. Therefore, the drain of the storage transistor is connected to the data line. In the write operation, the select MOSFET on the common source side is applied with a low level ("L") to turn off this select MOSFET. The common source of the storage MOSFETs is therefore made open. As illustratively shown in FIG. 16B, the data line is set to +Vd/0 V corresponding to the write signals of "1" and "0" to selectively change the threshold voltage of the storage MOSFET.

Although +Vd/0 V is applied to one storage MOSFET in FIG. 16B, the write signals are actually supplied to all the data lines, and the write operation is performed for all storage transistors connected to the word line in a select state. In this embodiment, tunnelling current is used for the write operation. Since the tunnelling current flowing through the storage transistor is very small, the collective write operation for about 4 K bits is possible. In a conventional write method, hot electrons are generated near the drain of a storage transistor to inject charges into the floating gate. Therefore, for example, even if the erase operation is performed in individual units of a word line by using tunnelling current, current flowing through the storage transistor during the write operation becomes very large. Accordingly, it is to be noted that a large amount of data cannot be written collectively using the conventional write method, unlike the present invention.

Referring to FIG. 16C, in the memory space, a select signal of the word line is used as a sector address. Specifically, sectors 0–n are assigned in correspondence with the addresses of word lines and the write operation is performed in individual units of such a sector. For the preparation of the write operation of data into the storage transistors of one sector, the write data is serially input to the register. After the data for the one sector is input, the write data stored in the register is transferred to each data line to collectively write the data into the storage transistors connected to a selected word line.

By dividing the memory cells into blocks as described above and applying power supply and ground potentials to the data line via the select MOSFET, stress of the non-selected memory cells can be alleviated. Namely, since the word line is set to a non-select state and the data line is set to a select state, the memory cells required to hold their data are prevented from being applied with the write data. In this embodiment, only a small number of memory cells in each block is subjected to the above-described stress.

FIGS. 17A and 17B are concept diagrams illustrating a read operation of a flash memory according to an embodiment of the invention. FIG. 17A is a circuit diagram of a memory array circuit, and FIG. 17B shows an address space. Memory cell biases are not shown because they can be easily understood from FIG. 17A.

The select word line is applied with a high level such as Vcc (+3 V). The non-selected word line is applied with a low level such as 0 V. The data line is pre-charged to a bias voltage such as +Vrd (+1 V) as illustratively shown in FIG. 17A. If the storage transistor is in an erase state, the threshold voltage is high relative to the select level Vcc of the word line so that the storage transistor turns off and the potential at the data line remains +Vrd. Conversely, if the write operation has been performed and the threshold voltage is low relative to the select level Vcc of the word line, the storage transistor turns on and the pre-charge voltage Vrd at the data line is discharged. In the above manner, the potential at the data line is made high or low level in accordance with the data in the storage transistor to thereby read the data.

Although +Vrd is applied to one storage MOSFET in FIG. 17A, the pre-charge voltages +Vrd are actually supplied to all the data lines, and the read operation is performed for all storage transistors connected to the word line in a select state. For this collective read operation, the sense amplifier shown in FIG. 1 performs amplification and latch operation.

Referring to FIG. 17C, in the memory space, a select signal of the word line is used as a sector address. Specifically, sectors 0–n are assigned in correspondence with the addresses of word lines and the read operation is performed in individual units of such a sector. The read operation of data from the storage transistors of one sector is performed in two stages. In the first stage, the read data from the storage transistors is sensed and latched in parallel by the register corresponding to the sense amplifier shown in FIG. 1. In the second stage, the read data stored in the register is output serially synchronously with the count operation of the Y address counter.

FIG. 18 is a general layout of a flash memory according to an embodiment of the invention. In FIG. 18, pads are disposed at the left of a vertically long semiconductor chip, the pads being connected to input/output terminals, control terminals, and power supply terminals. At the upper left of the semiconductor chip, circuits for an input section and a control section are disposed adjacent the pads, and at the lower left, a circuit for a power supply section is disposed for generating various internal voltages necessary for the erase, write, and read operations.

A sense/latch is disposed laterally at the center of the semiconductor chip. This sense/latch corresponds to the column switch 34 shown in FIG. 1 and includes a column switch as well as a sense/latch circuit. Data input output lines of one byte laterally extend from the sense/latch. Memory arrays are disposed on upper and lower sides of the sense/latch. These memory arrays correspond to the memory arrays 30 and 31 shown in FIG. 1. The upper and lower memory arrays are also divided into right and left memory arrays. In the vertical direction, a main word decoder and a sub-word decoder are provided. The word line extends laterally. The main word decoder performs select/non-select of the select MOSFET shown in FIG. 1, and the sub-word decoder performs select/non-select of the word line connected to memory cells. The sub-word decoder includes a word driver. Since the sub-word decoder is disposed at the central area of the memory arrays, a load on the word driver can be reduced and the drive operation can be performed at high speed.

At the upper right of the semiconductor chip, a power ratio pulse generator circuit is provided. By using a pulse, the erase and write operations are performed in accordance with a well known high speed algorithm. By using one pulse, an erase (write) operation is performed for one unit of memory cells, the threshold voltage of each storage MOSFET is verified, and, if the threshold voltage is insufficient, the erase (write) operation is again performed. The width of the next pulse controlling the next erase (write) time is set to a half of the previous pulse width, i.e., a width corresponding to an inverse of a power ratio. In this manner, excessive erase (write) is avoided and efficient erase (write) is ensured.

At the lower right of the semiconductor chip, circuitry for a relief section is provided. The relief section includes the ROM array made of fuses or the like, ROM address counter, and a comparator. The Y address counter is also disposed in this relief section to facilitate replacement of the skip destination address or the like. The Y address signal generated by the Y address counter is supplied to the Y decoder disposed at the middle right end. The Y decoder generates a select signal for the column switch included in the sense/latch and generates a select signal for each sense/latch (one-to-one correspondence with each data line) for serial data transfer.

In this embodiment, the relief section, power ratio pulse generator circuit, and Y decoder are disposed at the right side of the semiconductor chip, whereas the input/output series circuit is disposed at the left side. Therefore, wiring patterns of the input portion of the Y decoder are not congested with those at the left side of the chip. Therefore, a space between wiring patterns becomes broad and the width of each wiring pattern can be made uniform. The influence of parasitic elements can be reduced and the electric characteristics can be improved. Since the wiring is easy, the number of layout processes can be reduce.

The advantages of the above embodiments are as follows.
(1) In a semiconductor storage device wherein data lines connected to a plurality of memory cells selected by a select operation of word lines are sequentially selected by using an address signal generated by an address counter to serially read data in individual units of at least word line: redundancy data lines disposed perpendicular to the word lines are provided; a column select circuit receiving a Y address signal selects one of the data lines or redundancy data lines; a redundancy memory circuit stores, in the order of the selection operation by the column select circuit, a defect address signal of a defect data line among the data lines and a redundancy address signal of a corresponding redundancy data line; an address comparator circuit compares one defect address signal read from the redundancy memory circuit with an address signal generated by the address counter; an address signal for the redundancy memory circuit is generated by performing a count operation in response to a coincidence signal generated by the address comparator circuit; and the address signal generated by the address counter is replaced by a redundancy address signal read in response to the coincidence signal from the redundancy memory circuit and used as the Y address signal. Accordingly, a redundancy circuit of simple configuration can be obtained because only a single address comparator circuit is used.

(2) The redundancy memory circuit stores as the redundancy address signal an address signal having only lower bits corresponding to the number of redundancy data lines of the redundancy array. Accordingly, the memory capacity of a ROM such as a fuse array can be reduced.

(3) The semiconductor storage device further comprises a management array having a plurality of data lines for management bits crossing the plurality of word lines, wherein the redundancy data line of the redundancy array is used also for relieving a defect data line for the management bit. Accordingly, a flash memory easy to use can be realized and the relief efficiency of the redundancy circuit can be improved.

(4) In a semiconductor storage device wherein data lines connected to a plurality of memory cells selected by a select operation of word lines are sequentially selected by using an address signal generated by an address counter to serially read data in individual units of at least word line: a redundancy memory circuit stores, in the order of data line selection operation, a defect address signal of a defect data line in the normal memory array: an address comparator circuit compares one defect address signal read from the redundancy memory circuit with an address signal generated by the address counter; and the count operation of the address counter is controlled by a coincidence signal generated by the address comparator circuit to substantially skip the defect address and relieve the defect data line. Accordingly, a redundancy circuit of simple configuration can be obtained because only a single address comparator circuit is used.

(5) The plurality of data lines are used for the normal data lines and redundancy data lines without discriminating therebetween, and have data lines corresponding in number to those accessible by the address signal generated by the address counter and data lines corresponding in number to those which can be relieved by using the redundancy memory circuit. Accordingly, the defect redundancy data line can also be relieved.

(6) If electrically erasable and programmable non-volatile memory cells which can be collectively erased in individual units of a word line are used, a standard mass storage controller such as a hard disk controller can be used. Accordingly, configuration of a memory system becomes easy, and the flash memory becomes compatible with a file memory such as a hard disk memory, and the file memory can be easily replaced by the flash memory.

(7) A combination of control signals and clock signals is supplied and a command for designating one of various operation modes and an X address signal for selecting one of a plurality of word lines are time divisionally input from data terminals. Accordingly, a flash memory easy to use can be realized.

The invention made by the prevent inventors has been described specifically with reference to the embodiments. The invention is not limited to the above embodiments, but various modifications are possible without departing from the scope of the invention. For example, memory cells may be read-only memory cells such as mask ROMs, and volatile memory cells such as static and dynamic memory cells, in addition to non-volatile memory cells. If dynamic memory cells are used, a refresh function is added. The structures of circuits constituting the redundancy circuit may be modified in various ways. A redundancy circuit which replaces a defect word line by a reserved word line may be used. The invention is widely applicable to other semiconductor storage devices using serial input/output.

The advantages obtained by typical ones of the inventions disclosed in this specification are briefly described in the following. In a semiconductor storage device wherein data lines connected to a plurality of memory cells selected by a select operation of word lines are sequentially selected by using an address signal generated by an address counter to serially read data in individual units of at least word line: redundancy data lines disposed perpendicular to the word lines are provided; a column select circuit receiving a Y address signal selects one of the data lines or redundancy data lines; a redundancy memory circuit stores, in the order of the selection operation by the column select circuit, a defect address signal of a defect data line among the data lines and a redundancy address signal of a corresponding redundancy data line; an address comparator circuit compares one defect address signal read from the redundancy memory circuit with an address signal generated by the address counter; an address signal for the redundancy memory circuit is generated by performing a count operation in response to a coincidence signal generated by the address comparator circuit; and the address signal generated by the address counter is replaced by a redundancy address signal read in response to the coincidence signal from the redundancy memory circuit and used as the Y address signal. Accordingly, a redundancy circuit of simple configuration can be obtained because only a single address comparator circuit is used.

In a semiconductor storage device wherein data lines connected to a plurality of memory cells selected by a select operation of word lines are sequentially selected by using an address signal generated by an address counter to serially read data in individual units of at least word line: a redundancy memory circuit stores, in the order of data line selection operation, a defect address signal of a defect data line in the normal memory array: an address comparator circuit compares one defect address signal read from the redundancy memory circuit with an address signal generated by the address counter; and the count operation of the address counter is controlled by a coincidence signal generated by the address comparator circuit to substantially skip the defect address and relieve the defect data line. Accordingly, a redundancy circuit of simple configuration can be obtained because only a single address comparator circuit is used.

What is claimed is:

1. A semiconductor memory device comprising:

a normal memory array having a plurality of memory cells disposed in a matrix, each memory cell being disposed at each cross point between a plurality of word lines and a plurality of data lines;

a redundancy array having a plurality of redundancy memory cells disposed in a matrix, each redundancy memory cell being disposed at each cross point between the plurality of word lines and a plurality of redundancy data lines;

an address counter for generating an address signal which selects one of the data lines of said normal memory array;

a column select circuit for selecting one of the data lines in said normal memory array or in said redundancy memory array in accordance with a Y address signal;

a redundancy memory circuit for storing, in the order of a selection operation by said column select circuit, a defect signal of a defect data line of said normal memory array and a redundancy address signal assigned to said redundancy array;

an address comparator circuit for comparing one defect address signal read from said redundancy memory circuit with an address signal generated by said address counter;

a redundancy address counter performing a count operation in response to a coincidence signal from said address comparator circuit and generating an address signal for reading a next defect address signal from said redundancy memory circuit; and a redundancy address select circuit responsive to the address signal generated by said redundancy address counter for reading one defect address signal and its corresponding redundancy address signal from said redundancy memory circuit, wherein in response to the coincidence signal from said address comparator circuit, the address signal generated by said address counter is replaced by the redundancy address signal read from said redundancy memory circuit to use the redundancy address signal as the Y address signal.

2. A semiconductor memory device according to claim 1, wherein said redundancy memory circuit stores as the redundancy address signal an address signal having only lower bits corresponding to the number of redundancy data lines of said redundancy array, and the upper bits assigned to said redundancy array are fixedly set at the outside of said redundancy memory circuit and added to the lower bits to form the Y address signal.

3. A semiconductor memory device according to claim 1, further comprising a management array having a plurality of data lines for management bits crossing the plurality of word lines, wherein the redundancy data line of the redundancy array is used also for relieving a detect data line for the management bit.

4. A semiconductor memory device according to claim 1, wherein said redundancy memory circuit uses, as a memory cell, fuse means capable of being selectively blown out by application of a laser beam.

5. A semiconductor memory device according to claim 1, wherein the memory cells are electrically erasable and programmable non-volatile memory cells capable of being collectively erased in individual units of a word line.

6. A semiconductor memory device according to claim 1, wherein a combination of a control signal and a clock signal is used and a command for designating an operation mode and an X address signal for selecting one of the word lines are time divisionally input from a data terminal.

* * * * *